(12) United States Patent
Kim et al.

(10) Patent No.: US 12,339,170 B2
(45) Date of Patent: Jun. 24, 2025

(54) LONG WAVELENGTH INFRARED SENSOR AND ELECTRONIC DEVICE INCLUDING THE SAME

(71) Applicant: SAMSUNG ELECTRONICS CO., LTD., Suwon-si (KR)

(72) Inventors: Jinmyoung Kim, Hwaseong-si (KR); Byonggwon Song, Seoul (KR); Yooseong Yang, Yongin-si (KR); Duhyun Lee, Yongin-si (KR); Byungkyu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 589 days.

(21) Appl. No.: 17/836,568

(22) Filed: Jun. 9, 2022

(65) Prior Publication Data

US 2023/0213390 A1      Jul. 6, 2023

(30) Foreign Application Priority Data

Dec. 31, 2021   (KR) .................. 10-2021-0194549

(51) Int. Cl.
   *G01J 5/58*   (2022.01)
   *G01J 5/20*   (2006.01)
   *H10N 15/20*  (2023.01)

(52) U.S. Cl.
   CPC ............. *G01J 5/58* (2013.01); *H10N 15/20* (2023.02); *G01J 2005/202* (2013.01)

(58) Field of Classification Search
   CPC .......... G01J 5/0853; G01J 5/58; H10N 50/10; H10N 35/00; H10N 35/85; G01R 33/09;
   (Continued)

(56) References Cited

U.S. PATENT DOCUMENTS

| 4,952,811 A | * | 8/1990 | Elliott ................. H10F 77/1237 |
| | | | 250/493.1 |
| 10,288,494 B2 | | 5/2019 | Lu et al. |

(Continued)

FOREIGN PATENT DOCUMENTS

| JP | 4055005 B2 | 3/2008 |
| KR | 10-2014-0136340 A | 11/2014 |
| WO | 2021/021690 A1 | 2/2021 |

OTHER PUBLICATIONS

"UMN MTJ SPICE Model", University of Minnesota, 2015, http://mtj.umn.edu. (1 page total).

(Continued)

*Primary Examiner* — Noam Reisner
(74) *Attorney, Agent, or Firm* — Sughrue Mion, PLLC

(57) ABSTRACT

A long wavelength infrared sensor includes a first magnetoresistive unit; a second magnetoresistive unit; and a light absorption layer that absorbs light and emits heat, wherein the first magnetoresistive unit includes a first magnetoresistive element and a second magnetoresistive element electrically connected to each other, the second magnetoresistive unit includes a third magnetoresistive element and a fourth magnetoresistive element electrically connected to each other, the first and third magnetoresistive elements each have an antiparallel state of magnetization direction, the second and fourth magnetoresistive elements each have a parallel state of magnetization direction, and the first magnetoresistive element is electrically connected to the third magnetoresistive element by way of the second magnetoresistive element.

24 Claims, 29 Drawing Sheets

(58) Field of Classification Search
CPC ... G01R 33/096; G01R 33/098; G01R 15/205
See application file for complete search history.

(56) References Cited

U.S. PATENT DOCUMENTS

| | | | | |
|---|---|---|---|---|
| 2006/0056113 | A1* | 3/2006 | Fukushima | G11B 5/40 |
| | | | | 360/324.1 |
| 2013/0248714 | A1 | 9/2013 | Honda et al. | |
| 2017/0160248 | A1 | 6/2017 | Roizin et al. | |
| 2021/0404867 | A1 | 12/2021 | Jaiswal et al. | |
| 2022/0260425 | A1* | 8/2022 | Jacob | G01J 5/24 |

OTHER PUBLICATIONS

Fujisawa, D. et al., "Implementation of SOI diode uncooled IRFPA in TEC-less and shutter-less operation", Proceedings of SPIE, Infrared Technology and Applications XLIV, May 29, 2018. (10 pages total).

Communication issued May 24, 2023 by the European Patent Office in counterpart European Patent Application No. 22193402.9.

* cited by examiner

LONG WAVELENGTH INFRARED SENSOR AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0194549, filed on Dec. 31, 2021, in the Korean Intellectual Property Office, the disclosure of which is incorporated by reference herein in its entirety.

BACKGROUND

1. Field

The disclosure relates to a long wavelength infrared sensor and an electronic device.

2. Description of Related Art

There are two types of long wavelength infrared (LWIR) sensors: a quantum type infrared sensor and a thermal type infrared sensor. Quantum type sensors use a photoconductive phenomenon of semiconductor materials, and have excellent quantum efficiency and operate at very low temperature, so thermal noise is small, so the quantum type sensor has excellent detectivity and noise equivalent temperature difference (NETD) characteristics. However, the region that responds to infrared rays is determined depending on the energy gap, an operating temperature is near a liquid nitrogen temperature, and there is a disadvantage that a vacuum must be maintained for these characteristics. Because the quantum type sensor is very expensive, the quantum type sensor is mainly used for military purposes rather than civilian ones.

There are several types of thermal type sensors depending on the driving principle and material. For example, bolometer sensors use the principle that the resistance of a material changes depending on temperature; pyroelectrics and ferroelectrics sensors use changes in the polarization of materials depending on temperature; and thermopile sensors use the change in electromotive force depending on temperature. Bimetal sensors use a change in length depending on temperature.

SUMMARY

Provided is a long wavelength infrared sensor in which heat is effectively transferred to magnetoresistive elements having an antiparallel state.

Provided is a long wavelength infrared sensor that reduces manufacturing cost and manufacturing time.

However, the problem to be solved is not limited to the above disclosure.

Additional aspects will be set forth in part in the description which follows and, in part, will be apparent from the description, or may be learned by practice of embodiments of the disclosure.

In accordance with an aspect of the disclosure, a long wavelength infrared sensor includes a first magnetoresistive unit; a second magnetoresistive unit; and a light absorption layer that absorbs light and emits heat, wherein the first magnetoresistive unit includes a first magnetoresistive element and a second magnetoresistive element electrically connected to each other, wherein the second magnetoresistive unit includes a third magnetoresistive element and a fourth magnetoresistive element electrically connected to each other, wherein the first magnetoresistive element and the third magnetoresistive element each have an antiparallel state of magnetization direction, wherein the second magnetoresistive element and the fourth magnetoresistive element each have a parallel state of magnetization direction, and wherein the first magnetoresistive element is electrically connected to the third magnetoresistive element by way of the second magnetoresistive element.

The first magnetoresistive element may include a first lower magnetic layer, a first upper magnetic layer provided between the first lower magnetic layer and the light absorption layer, and a first tunneling barrier provided between the first lower magnetic layer and the first upper magnetic layer, and wherein the second magnetoresistive element includes a second lower magnetic layer, a second upper magnetic layer provided between the second lower magnetic layer and the light absorption layer, and a second tunneling barrier provided between the second lower magnetic layer and the second upper magnetic layer, wherein a magnetization direction of the first upper magnetic layer is antiparallel to a magnetization direction of the first lower magnetic layer, and wherein a magnetization direction of the second upper magnetic layer is parallel to a magnetization direction of the second lower magnetic layer.

The long wavelength infrared sensor may further include an upper conductive line electrically connecting the first upper magnetic layer to the second upper magnetic layer.

The first upper magnetic layer and the second upper magnetic layer may each have a changeable magnetization direction, and the first lower magnetic layer and the second lower magnetic layer may each have a fixed magnetization direction.

The first upper magnetic layer and the second upper magnetic layer may each have a fixed magnetization direction, and the first lower magnetic layer and the second lower magnetic layer may each have a changeable magnetization direction.

The long wavelength infrared sensor may further include a lower conductive line electrically connecting the first lower magnetic layer to the second lower magnetic layer.

The first magnetoresistive element and the third magnetoresistive element may have an antiparallel state based on a reset signal passing through all of the first magnetoresistive element, the second magnetoresistive element, the third magneto resistive element, and the fourth magnetoresistive element, and wherein the second magnetoresistive element and the fourth magnetoresistive element have a parallel state.

Each of the first magnetoresistive element, the second magnetoresistive element, the third magnetoresistive element, and the fourth magnetoresistive elements may include a lower magnetic layer, an upper magnetic layer provided between the lower magnetic layer and the light absorption layer, and a tunneling barrier layer provided between the lower magnetic layer and the upper magnetic layer, wherein a magnetization direction of the upper magnetic layer is antiparallel to a magnetization direction of the lower magnetic layer in each of the first magnetoresistive element and the third magnetoresistive element, and wherein a magnetization direction of the upper magnetic layer is parallel to a magnetization direction of the lower magnetic layer in each of the second magnetoresistive element and the fourth magnetoresistive element.

The long wavelength infrared sensor may further include a first upper conductive line electrically connecting the upper magnetic layer of the first magnetoresistive element to the upper magnetic layer of the second magnetoresistive element, and a second upper conductive line electrically connecting the upper magnetic layer of the third magnetoresistive element to the upper magnetic layer of the fourth magnetoresistive element; and a lower conductive line electrically connecting the lower magnetic layer of the second magnetoresistive element to the lower magnetic layer of the third magnetoresistive element.

The long wavelength infrared sensor may further include a first lower conductive line electrically connecting the lower magnetic layer of the first magnetoresistive element to the lower magnetic layer of the second magnetoresistive element, and a second lower conductive line electrically connecting the lower magnetic layer of the third magnetoresistive element to the lower magnetic layer of the fourth magnetoresistive element; and an upper conductive line electrically connecting the upper magnetic layer of the second magnetoresistive element to the upper magnetic layer of the third magnetoresistive element.

A distance between the first magnetoresistive unit and the second magnetoresistive unit may be about 100 nanometers (nm) to about 3 micrometers (μm).

A thickness of the light absorption layer may be about 3 μm to about 5 μm.

The long wavelength infrared sensor may further include a heat transfer via provided between the light absorption layer and the first magnetoresistive element.

The light absorption layer may include a plurality of layers, and the heat transfer via and a lowermost layer of the plurality of layers of the light absorption layer may form a single structure.

The light absorption layer may be spaced apart from the first magnetoresistive element, and a separation distance between the light absorption layer and the first magnetoresistive element may be about 1 μm or less.

The light absorption layer may be in direct contact with the first magnetoresistive element.

A distance between the first magnetoresistive element and the second magnetoresistive element may be about 100 nm to about 3 μm.

The long wavelength infrared sensor may further include a reflective layer provided on an opposite side of the light absorption layer with respect to the first magnetoresistive element and the second magnetoresistive element.

In accordance with an aspect of the disclosure, a long wavelength infrared sensor includes a plurality of magnetoresistive units; and a light absorption layer that absorbs light and emits heat, wherein each of the plurality of magnetoresistive units includes a first magnetoresistive element having an antiparallel state of magnetization direction and a second magnetoresistive element having a parallel state of magnetization direction, wherein the plurality of magnetoresistive units are electrically connected in series, and wherein for each of the magnetoresistive units, the first magnetoresistive element has the antiparallel state of magnetization direction and the second magnetoresistive element has the parallel state of magnetization direction, based on a reset signal being applied to the first magnetoresistive element of a magnetoresistive unit of the plurality of magnetoresistive units that is located at one end of the plurality of magnetoresistive units.

In accordance with an aspect of the disclosure, an electronic device includes a long wavelength infrared sensor; and a processor that controls an operation of the long wavelength infrared sensor, and stores and outputs a signal generated by the long wavelength infrared sensor, wherein the long wavelength infrared sensor includes a first magnetoresistive unit; a second magnetoresistive unit; and a light absorption layer that absorbs light and emits heat, wherein the first magnetoresistive unit includes a first magnetoresistive element and a second magnetoresistive element electrically connected to each other, wherein the second magnetoresistive unit includes a third magnetoresistive element and a fourth magnetoresistive element electrically connected to each other, wherein the first magnetoresistive element and the third magnetoresistive element have an antiparallel state of magnetization direction, wherein the second magnetoresistive element and the fourth magnetoresistive element have a parallel state of magnetization direction, and wherein the first magnetoresistive element is electrically connected to the third magnetoresistive element by way of the second magnetoresistive element.

In accordance with an aspect of the disclosure, a long wavelength infrared sensor includes a light absorption layer; a plurality of pixels, each pixel of the plurality of pixels including a plurality of magnetoresistive units, each of the plurality of magnetoresistive units including a first magnetoresistive element and a second magnetoresistive element; and a plurality of thermally conductive vias, each of the plurality of thermally conductive vias thermally connecting a portion of the light absorption layer to a respective pixel of the plurality of pixels, wherein each first magnetoresistive element and each second magnetoresistive element includes a pinned magnetic layer having a fixed magnetization direction and a free magnetic layer comprising a changeable magnetization direction.

Each thermally conductive via of the plurality of thermally conductive vias may be thermally connected to a respective first magnetoresistive element off the respective pixel.

A first magnetoresistive element of a first pixel of the plurality of pixels may be electrically connected to a reset signal, and a second magnetoresistive element of a last pixel of the plurality of pixels may be electrically connected to an output signal.

The plurality of pixels may be electrically connected in series such that each first magnetoresistive element except the magnetoresistive element of the first pixel is electrically connected to a second magnetoresistive element of a previous pixel of the plurality of pixels, and each second magnetoresistive element except the second magnetoresistive element of the last pixel may be connected to a first magnetoresistive element of a subsequent pixel of the plurality of pixels.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
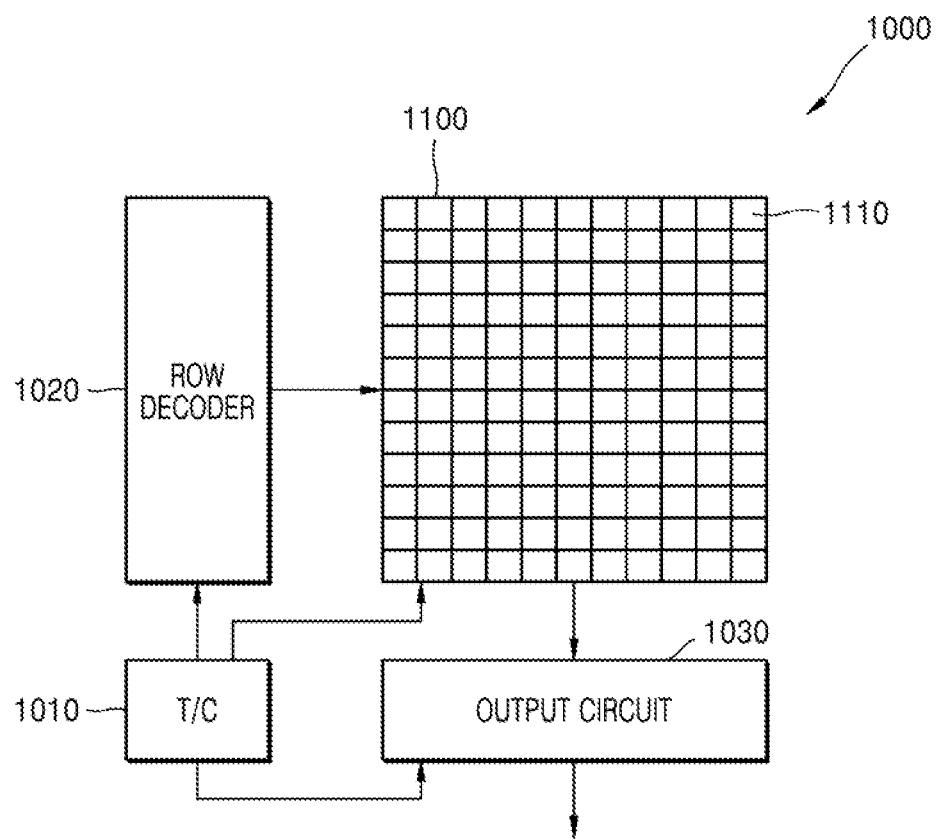
FIG. 1 is a schematic block diagram of a long wavelength infrared sensor according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings. In the drawings below, the same reference numerals refer to the same components, and the size of each component in the drawings may be exaggerated for clarity and convenience of description. Meanwhile, the embodiments described below are merely examples, and various modifications are possible from these embodiments.

Hereinafter, what is described as "on" may include those directly on in contact as well as those that are on non-contact.

The singular expression includes the plural expression unless the context clearly dictates otherwise. Also, when a portion "includes" a component, it means that other components may be further included, rather than excluding other components, unless otherwise stated.

In addition, terms such as " . . . portion" described in the specification mean a portion that processes at least one function or operation.

Hereinafter, 'at least one of a, b, and c' should be understood to include 'only a', 'only b', 'only c', 'a and b', 'a and c', 'b and c', or 'a, b, and c'.

Figure 2:
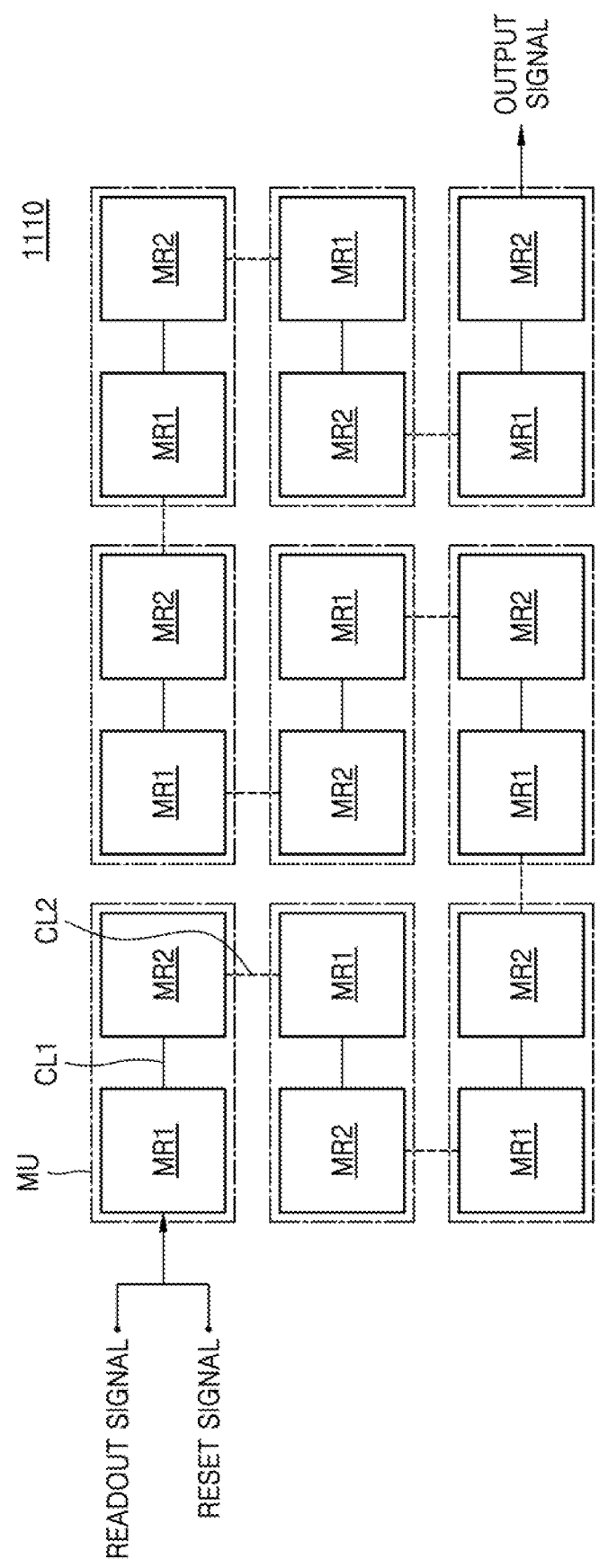
FIG. 2 illustrates a pixel of the long wavelength infrared sensor of FIG. 1 as an example.

FIG. 1 is a schematic block diagram of a long wavelength infrared sensor according to an example embodiment. FIG. 2 illustrates a pixel 1110 of the long wavelength infrared sensor of FIG. 1 as an example.

Referring to FIG. 1, a long wavelength infrared sensor 1000 may include a pixel array 1100, a timing controller 1010, a row decoder 1020, and an output circuit 1030. The pixel array 1100 may include a plurality of pixels 1110 that are two-dimensionally arranged along a plurality of rows and columns. The arrangement of the plurality of pixels 1110 may be implemented in various ways.

Referring to FIG. 2, the pixel 1110 may include a plurality of magnetoresistive units MU. In an example, the size of the pixel 1110 may be about 5 micrometers (μm) to about 25 μm. Although the magnetoresistive units MU arranged in a 3×3 form are illustrated, this is an example. An arrangement form of the magnetoresistive units MU may be determined as necessary. Each magnetoresistive unit MU may include a first magnetoresistive element MR1 and a second magnetoresistive element MR2 electrically connected to each other. For example, the first and second magnetoresistive elements MR1 and MR2 may be magnetic tunneling junction (MTJ) elements. Each of the first and second magnetoresistive elements MR1 and MR2 may have a size of about 30 nanometers (nm) to about 1000 nm. Each of the first and second magnetoresistive elements MR1 and MR2 may include a pinned layer having a fixed magnetization direction, a free layer having a changeable magnetization direction, and a tunneling barrier layer disposed between the pinned layer and the free layer. Detailed structures of the first and second magnetoresistive elements MR1 and MR2 will be described later. In the disclosure, a magnetoresistive element including a free layer and a pinned layer having antiparallel magnetization directions is referred to as a magnetoresistive element having an antiparallel state, and a magnetoresistive element including a free layer and a pinned layer having magnetization directions parallel to each other is referred to as a magnetoresistive element having a parallel state. In the disclosure, parallel and antiparallel may include not only perfectly parallel and antiparallel, but also substantially parallel and antiparallel. The first and second magnetoresistive elements MR1 and MR2 may have different magnetization states. When the first magnetoresistive element MR1 has an antiparallel state, the second magnetoresistive element MR2 may have a parallel state, and when the first magnetoresistive element MR1 has a parallel state, the second magnetoresistive element MR2 may have an antiparallel state.

A magnetoresistive element having an antiparallel state may have a greater resistance than a magnetoresistive element having a parallel state. A magnetoresistive element having an antiparallel state may have a temperature dependence in which a magnetization direction changes depending on a temperature. For example, the free layer of the magnetoresistive element having an antiparallel state has a magnetization direction antiparallel to the magnetization direction of the pinned layer at a low temperature, but as the temperature increases, the magnetization direction of the free layer may be tilted in a direction parallel to the magnetization direction of the pinned layer. The temperature dependence of the magnetoresistive element having an antiparallel state may be expressed as a temperature coefficient of resistance (TCR). The resistance of the magnetoresistive element having an antiparallel state may decrease as the temperature of the magnetoresistive element increases. For example, the amount of change in resistance per unit temperature of the magnetoresistive element having an antiparallel state may be about 0.15%/K to about 0.3%/K. The resistance of a magnetoresistive element having a parallel state may have substantially no temperature dependence.

The magnetoresistive elements having an antiparallel state may be connected in series by the magnetoresistive elements having a parallel state. The series connection of the plurality of magnetoresistive elements having an antiparallel state may refer, for example, to an electrical connection between a magnetic layer of one magnetoresistive element having a first magnetization direction and a magnetic layer of another magnetoresistive element having a second magnetization direction different from the first magnetization direction. The magnetoresistive elements having a parallel state may serve as a conductive line connecting the magnetoresistive elements having an antiparallel state. When a plurality of magnetoresistive elements having an antiparallel state are connected in series, an amount of change in resistance per temperature of the pixel 1110 may increase in proportion to the number of connected magnetoresistive elements. A detailed connection aspect will be described later. Because the size (about 30 nm to about 1000 nm) of the magnetoresistive elements is smaller than the size (about 5 μm to about 25 μm) of the pixel, a plurality of magnetoresistive units may be arranged in a unit pixel. In addition, each of the plurality of magnetoresistive elements may have a characteristic error that is different from a required characteristic. A characteristic error may be a factor in generating noise. When connecting a plurality of magnetoresistive elements in series as in the disclosure, the magnitude of noise generated due to the characteristic error is equal to the average noise caused by the plurality of magnetoresistive elements divided by the number of magnetoresistive elements connected in series. Accordingly, noise caused by a characteristic error of a plurality of magnetoresistive elements may be reduced.

A light absorption layer, which will be described later, may absorb light (e.g., long-wavelength infrared rays) to generate heat. Because the temperature of the magnetoresistive elements having the antiparallel state is increased by heat, the resistance of the magnetoresistive elements having the antiparallel state may be lowered. The temperature of the magnetoresistive element having a parallel state may be increased by heat, but the magnetoresistive element having a parallel state may have a constant resistance because the magnetoresistive element having a parallel state does not substantially have temperature dependence.

A first conductive line CL1 may be provided between the first magnetoresistive element MR1 and the second magnetoresistive element MR2 in each of the magnetoresistive units MU. The first conductive line CL1 may electrically connect the first magnetoresistive element MR1 to the second magnetoresistive element MR2 in each of the magnetoresistive units MU. The first conductive line CL1 may connect lower magnetic layers or upper magnetic layers of the first and second magnetoresistive elements MR1 and MR2 in a manner to be described later.

A second conductive line CL2 may be provided between the second magnetoresistive element MR2 and the first magnetoresistive element MR1 in different magnetoresistive units MU. The second conductive line CL2 may electrically connect the second magnetoresistive element MR2 to the first magnetoresistive element MR1 in different magnetoresistive units MU. The second conductive line CL2 may connect magnetic layers opposite to the magnetic layers which are connected to the first conductive line CL1. For example, when the first conductive line CL1 connects the lower magnetic layers, the second conductive line CL2 connects the upper magnetic layers. For example, when the first conductive line CL1 connects the upper magnetic layers, the second conductive line CL2 connects the lower magnetic layers.

A readout signal or a reset signal may be applied to the magnetoresistive unit MU disposed at one end of the magnetoresistive units MU. For example, the readout signal may be a current signal for the long wavelength infrared sensor 1000 to perform a readout operation. For example, the reset signal may be a current signal for initializing the first magnetoresistive element MR1 and the second magnetoresistive element MR2 to an antiparallel state or a parallel state. An output signal may be measured from the magnetoresistive unit MU disposed at the other end of the magnetoresistive units MU. For example, the output signal may be an output voltage signal. The intensity of the long-wavelength infrared rays may be measured based on the output signal.

Referring back to FIG. 1, the row decoder 1020 selects and controls one of the rows of the pixel array 1100 in response to a row address signal output from the timing controller 1010. The row decoder 1020 may transmit, to the selected row, a readout signal and a reset signal for resetting the selected row. The readout signal and the reset signal may be substantially the same as the readout signal and the reset signal applied to the magnetoresistive unit MU.

The output circuit 1030 may include a column decoder, an integrator, and an analog to digital converter (ADC). The column decoder may select a column. The output circuit 1030 measures an output signal from the pixel array 1100 arranged along the selected row in units of columns.

The integrator may accumulate the output signal and provide the accumulated signal to the ADC. The ADC may convert the accumulated voltage into a digital voltage value and output the converted voltage. Accordingly, the signal output from the ADC may be expressed as a step function that increases step by step with time. A plurality or one ADC may be provided. For example, the plurality of ADCs may be respectively disposed for each column between the column decoder and the columns, and one ADC may be provided to an output terminal of the column decoder.

The timing controller 1010, the row decoder 1020, and the output circuit 1030 may be implemented as a single chip or as separate chips. In an example, an image processor for processing the image signal output through the output circuit 1030 may be implemented as a single chip together with the timing controller 1010, the row decoder 1020, and the output circuit 1030.

Figure 3:
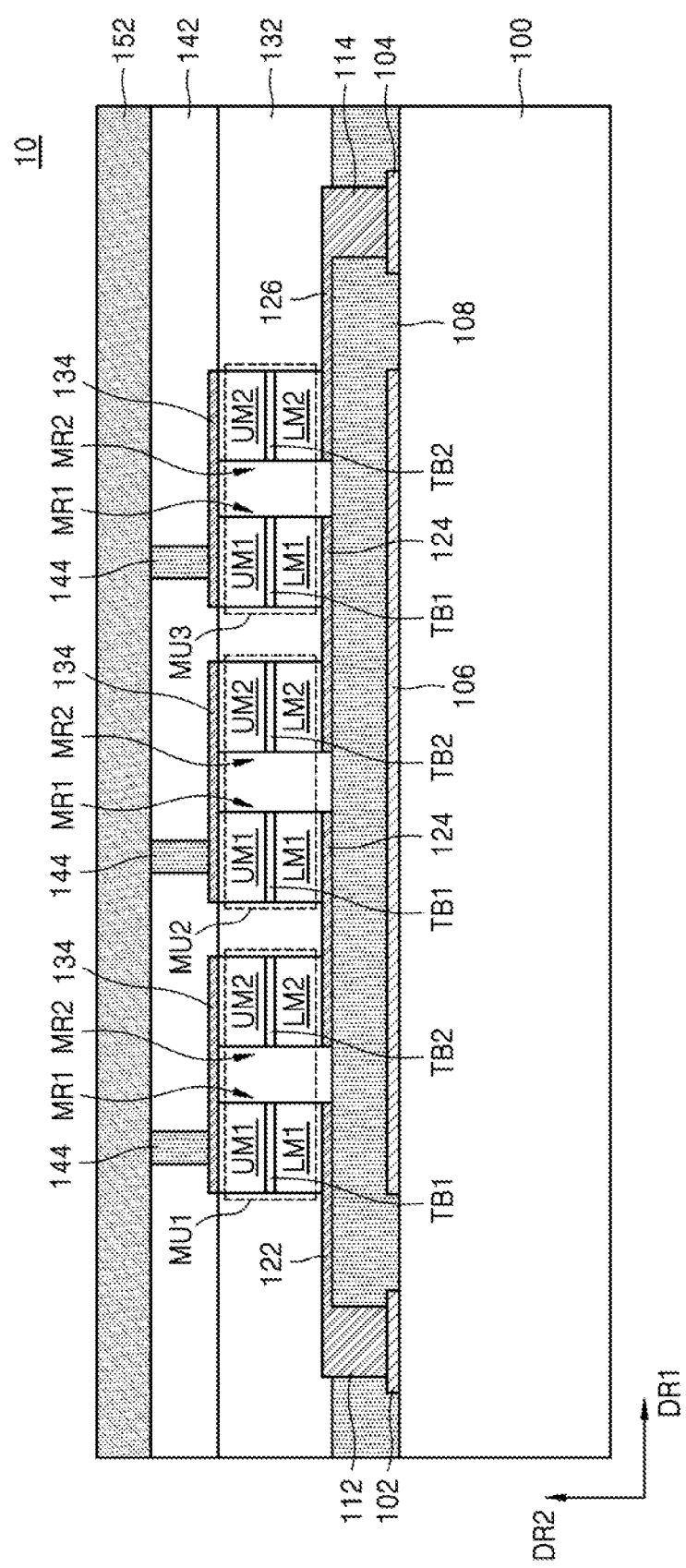
FIG. 3 is a cross-sectional view of a long wavelength infrared sensor according to an embodiment.

FIG. 3 is a cross-sectional view of a long wavelength infrared sensor according to an example embodiment.

Referring to FIG. 3, a substrate 100 may be provided. The substrate 100 may be a semiconductor substrate on which electronic elements and wirings are formed. For example, the substrate 100 may include silicon (Si), germanium (Ge), or silicon germanium (SiGe). The substrate 100 may be a readout integrated circuit (ROIC) substrate for controlling a long wavelength infrared sensor 10. For example, the substrate 100 may include the timing controller 1010, the row decoder 1020, and the output circuit 1030 described with reference to FIGS. 1 and 2. The electronic elements and the wirings apply a reset signal or a readout signal to the magnetoresistive elements MR1 and MR2 to be described later, and may transmit output signals generated from the magnetoresistive elements MR1 and MR2 to the output circuit.

A first pad 102 and a second pad 104 may be provided on the substrate 100. The first pad 102 and the second pad 104 may be electrically connected to different wires mounted on the substrate 100. The first pad 102 and the second pad 104 may include an electrically conductive material. For example, the first pad 102 and the second pad 104 may include at least one of a titanium nitride (TiN), platinum (Pt), palladium (Pd), tungsten (W), titanium (Ti), aluminum (Al), nickel (Ni), molybdenum (Mo), copper (Cu), and gold (Au).

A reflective layer 106 may be provided on the substrate 100. The reflective layer 106 may reflect the light passing through a light absorption layer 152 to be described later and provide the reflected light back to the light absorption layer 152. Accordingly, the long-wavelength infrared absorptivity of the light absorption layer 152 may increase. The reflective layer 106 may be disposed between the first pad 102 and the second pad 104 and spaced apart from at least one of the first pad 102 and the second pad 104. The reflective layer 106 may include a metal. For example, the reflective layer 106 may include at least one of a titanium nitride (TiN), platinum (Pt), palladium (Pd), tungsten (W), titanium (Ti), aluminum (Al), nickel (Ni), molybdenum (Mo), copper (Cu), and gold (Au). In an example, the reflective layer 106 may include substantially the same material as the first pad 102 and the second pad 104. In an example, the reflective layer 106 may be formed together when the first pad 102 and the second pad 104 are formed. However, if necessary, the reflective layer 106 may not be provided.

A first insulating layer 108 may be provided on the substrate 100. The first insulating layer 108 may cover the first pad 102, the second pad 104, and the reflective layer 106. For example, the first insulating layer 108 may include at least one of $SiO_2$, $Al_2O_3$, $HfO_2$, and $Si_xN_y$. The thickness of the first insulating layer 108 may be about 0.5 μm about 1 μm.

A first via 112 may be provided on the first pad 102. The first via 112 may pass through the first insulating layer 108. For example, the first via 112 may extend in a second direction DR2. The first via 112 may include an electrically conductive material. For example, the first via 112 may include at least one of a titanium nitride layer (TiN), platinum (Pt), palladium (Pd), tungsten (W), titanium (Ti), aluminum (Al), nickel (Ni), a nickel-chromium (NiCr) alloy, copper (Cu), and gold (Au). The first via 112 may electrically connect the first pad 102 to a first lower conductive line 122 to be described later. For example, the first via 112 may directly contact the first pad 102 and the first lower conductive line 122.

A second via 114 may be provided on the second pad 104. The second via 114 may pass through the first insulating layer 108. For example, the second via 114 may extend in the second direction DR2. The second via 114 may include an electrically conductive material. For example, the second via 114 may include at least one of a titanium nitride layer (TiN), platinum (Pt), palladium (Pd), tungsten (W), titanium (Ti), aluminum (Al), nickel (Ni), a nickel-chromium (NiCr) alloy, copper (Cu), and gold (Au). The second via 114 may electrically connect the second pad 104 to a third lower conductive line 126 to be described later. For example, the second via 114 may directly contact the second pad 104 and the third lower conductive line 126.

Magnetoresistive units MU1, MU2, and MU3 may be provided on the first insulating layer 108. Three magnetoresistive units MU1, MU2, and MU3 are shown, but these are examples. The number of magnetoresistive units may be determined as needed. The magnetoresistive units may be arranged in various shapes. For example, the magnetoresistive units may be arranged in a 3×3 form on the substrate 100 as shown in FIG. 2. Hereinafter, the three magnetoresistive units MU1, MU2, and MU3 may be referred to as a first magnetoresistive unit MU1, a second magnetoresistive unit MU2, and a third magnetoresistive unit MU3, respectively. A distance between the magnetoresistive units MU1, MU2, and MU3 may be about 100 nm to about 3 μm.

Each of the first to third magnetoresistive units MU1, MU2, and MU3 may include a first magnetoresistive element MR1 and a second magnetoresistive element MR2. A distance between the first magnetoresistive element MR1 and the second magnetoresistive element MR2 may be about 100 nm to about 3 μm. The first and second magnetoresistive elements MR1 and MR2 may include lower magnetic layers LM1 and LM2, upper magnetic layers UM1 and UM2, and tunneling barrier layers TB1 and TB2, respectively. The lower magnetic layers LM1 and LM2, the upper magnetic layers UM1 and UM2, and the tunneling barrier layers TB1 and TB2 may be referred to as MTJ. The lower magnetic layers LM1 and LM2, the tunneling barrier layers TB1 and TB2, and the upper magnetic layers UM1 and UM2 may be arranged in the second direction DR2 perpendicular to the upper surface of the substrate 100. A width of each of the first and second magnetoresistive elements MR1 and MR2 may be about 30 nm to about 1000 nm.

The lower magnetic layers LM1 and LM2 and the upper magnetic layers UM1 and UM2 may have a horizontal or vertical magnetization direction. The horizontal magnetization direction may refer to a magnetization direction parallel to the upper surface of the substrate 100. The perpendicular magnetization direction may refer to a magnetization direction perpendicular to the upper surface of the substrate 100. The lower magnetic layers LM1 and LM2 may be a pinned layer having a fixed magnetization direction or a free layer having a changeable magnetization direction. When the lower magnetic layers LM1 and LM2 are pinned layers, the upper magnetic layers UM1 and UM2 may be free layers. When the lower magnetic layers LM1 and LM2 are free layers, the upper magnetic layers UM1 and UM2 may be pinned layers. For brevity of explanation, an embodiment in which the lower magnetic layers LM1 and LM2 are pinned layers and the upper magnetic layers UM1 and UM2 are free layers will be described below. The magnetization direction of the free layer may be changed in a direction parallel to or antiparallel to the magnetization direction of the pinned layer.

In an example, the lower magnetic layers LM1 and LM2 may have a fixed horizontal magnetization direction in one direction parallel to the upper surface of the substrate 100. For example, the lower magnetic layers LM1 and LM2 may have a magnetization direction fixed to the first direction DR1. The lower magnetic layers LM1 and LM2 may include a ferromagnetic material. In an example, the lower magnetic layers LM1 and LM2 may include at least one of an Fe alloy, a Co alloy, and a Ni alloy having magnetism. For example, the lower magnetic layers LM1 and LM2 may include at least one of cobalt iron boron (CoFeB), cobalt iron (CoFe), nickel iron (NiFe), cobalt iron platinum (CoFePt), cobalt iron palladium (CoFePd), cobalt iron chromium (CoFeCr), cobalt iron terbium (CoFeTb), cobalt iron gadolinium (CoFeGd), and cobalt iron nickel (CoFeNi). For example, the thickness of the lower magnetic layers LM1 and LM2 may be about 1 μm or less.

In an example, the lower magnetic layers LM1 and LM2 may have a perpendicular magnetization direction fixed in one direction perpendicular to the upper surface of the substrate 100. For example, the lower magnetic layers LM1 and LM2 may have a magnetization direction fixed to the second direction DR2. The lower magnetic layers LM1 and LM2 may include at least one of a perpendicular magnetic material such as CoFeTb, CoFeGd, and CoFeDy, a perpendicular magnetic material having an $L1_0$ structure such as FePt having an $L1_0$ structure, FePd having an $L1_0$ structure, CoPd having an $L1_0$ structure, and CoPt having an $L1_0$ structure, a CoPt alloy having a hexagonal close packed lattice structure, and a perpendicular magnetic structure. The perpendicular magnetic structure may include magnetic patterns and non-magnetic patterns that are alternately and repeatedly stacked. For example, the perpendicular magnetic structure may include a (Co/Pt)n stacked structure, a (CoFe/Pt)n stacked structure, and a (CoFe/Pd)n stacked structure, a (Co/Pd)n stacked structure, a (Co/N)n stacked structure, a (Co/Ni)n stacked structure, a (CoNi/Pt)n stacked structure, a (CoCr/Pt)n stacked structure, a (CoCr/Pd)n stacked structure (n is a natural number) or a combination thereof. For example, the thickness of the lower magnetic layers LM1 and LM2 may be about 1 μm or less.

The upper magnetic layers UM1 and UM2 may have a changeable magnetization direction depending on temperature. For example, when the lower magnetic layers LM1 and LM2 have a horizontal magnetization direction, the upper magnetic layers UM1 and UM2 may have a horizontal magnetization direction parallel to or antiparallel to the magnetization direction of the lower magnetic layers LM1 and LM2. For example, when the lower magnetic layers LM1 and LM2 have a perpendicular magnetization direction, the upper magnetic layers UM1 and UM2 may have a perpendicular magnetization direction parallel to or antiparallel to the magnetization direction of the lower magnetic layers LM1 and LM2. The upper magnetic layers UM1 and UM2 may include at least one of a magnetic Fe alloy, a Co alloy, or a Ni alloy. For example, the upper magnetic layers UM1 and UM2 may include at least one of cobalt iron boron (CoFeB), cobalt iron (CoFe), nickel iron (NiFe), cobalt iron platinum (CoFePt), cobalt iron palladium (CoFePd), cobalt iron chromium (CoFeCr), cobalt iron terbium (CoFeTb), cobalt iron gadolinium (CoFeGd), and cobalt iron nickel (CoFeNi). For example, the thickness of the upper magnetic layers UM1 and UM2 may be about 1 μm or less.

The tunneling barrier layers TB1 and TB2 may be interposed between the lower magnetic layers LM1 and LM2 and the upper magnetic layers UM1 and UM2. The tunneling barrier layers TB1 and TB2 may include a non-magnetic material. For example, the tunneling barrier layers TB1 and TB2 may include at least one of a metal oxide such as aluminum oxide, magnesium oxide, titanium oxide, magnesium-zinc oxide, and magnesium-boron oxide, graphene, and non-magnetic metallic materials such as copper (Cu), ruthenium (Ru), or tantalum (Ta). In an example, the lower magnetic layers LM1 and LM2, the tunneling barrier layers TB1 and TB2, and the upper magnetic layers UM1 and UM2 may be a CoFeB layer, an MgO layer, and a CoFeB layer, respectively. The thickness of the tunneling barrier layers TB1 and TB2 may be determined such that heat sufficiently stays in the first magnetoresistive element MR1 and electrons may tunnel through the tunneling barrier layers TB1 and TB2. The thickness of the tunneling barrier layers TB1 and TB2 may be about 100 nm or less. For example, the thickness of the tunneling barrier layers TB1 and TB2 may be from about 1 nm to about 10 nm. When the thickness of the tunneling barrier layers TB1 and TB2 is too thin, heat may not stay for a time required for the first magnetoresistive element MR1. When the thickness of the tunneling barrier layers TB1 and TB2 is too thick, it may be difficult for electrons to tunnel through the tunneling barrier layers TB1 and TB2.

In the disclosure, the lower magnetic layer LM1, the upper magnetic layer UM1, and the tunneling barrier layer TB1 of the first magnetoresistive element MR1 may be referred to as a first lower magnetic layer LM1, a first upper magnetic layer UM1, and a first tunneling barrier layer TB1, respectively, and the lower magnetic layer LM2, the upper magnetic layer UM2, and the tunneling barrier layer TB2 of the second magnetoresistive element MR2 may be referred to as a second lower magnetic layer LM2, a second upper magnetic layer UM2, and a second tunneling barrier layer TB2, respectively. When the light absorption layer 152 to be described later absorbs light (e.g., long-wavelength infrared rays) to generate heat, temperatures of the first and second magnetoresistive elements MR1 and MR2 may be increased. As the temperature of first magnetoresistive elements MR1 having an antiparallel state increases, the magnetization direction of a first upper magnetic layers UM1, which are free layers, may be tilted in a direction toward the parallel state. Accordingly, the first magnetoresistive elements MR1 may have a resistance that decreases as the temperature increases. In other words, the resistance of the first magnetoresistive elements MR1 has a temperature dependence. For example, the resistance change amount per temperature of the first magnetoresistive elements MR1 may be about 0.15%/K to about 0.3%/K. The magnetization direction of a second upper magnetic layers UM2, which are free layers of the second magnetoresistive elements MR2 having a parallel state, may not substantially change even when the temperature increases. Accordingly, even when the temperature of the second magnetoresistive elements MR2 increases, the resistance of the second magnetoresistive elements MR2 may not substantially change.

When the first magnetoresistive elements MR1 having an antiparallel state are connected in series, the resistance change amount per temperature may increase in proportion to the number of the connected first magnetoresistive elements MR1. The series connection of the first magnetoresistive elements MR1 having an antiparallel state may be, for example, an electrical connection between the first upper magnetic layer UM1 and the first lower magnetic layer LM1 respectively included in different magnetoresistive units MU1, MU2, and MU3. In the disclosure, the first upper magnetic layer UM1 and the first lower magnetic layer LM1 respectively included in different magnetoresistive units MU1, MU2, and MU3 may be electrically connected to each other by a second magnetoresistive element MR2, an upper conductive line 134 and a second lower conductive line 124 to be described later. Because the second magnetoresistive element MR2 has a parallel state, the second magnetoresistive element MR2 has a low resistance, and thus may serve as an electrically conductive via electrically connecting the upper conductive line 134 to the second lower conductive line 124. Unlike the disclosure, when using vias including an electrically conductive material (e.g., metal) instead of the second magnetoresistive elements MR2, it may be difficult for heat generated in the light absorption layer 152 to be effectively transferred to the first magnetoresistive elements MR1 due to the high thermal conductance of the vias, and manufacturing cost and manufacturing time for forming the via may be additionally required.

Because the disclosure uses the second magnetoresistive elements MR2 having lower thermal conductivity than the via, heat may be effectively transferred to the first magnetoresistive elements MR1. Because the second magnetoresistive elements MR2 may be produced by the same process as the first magnetoresistive elements MR1, manufacturing cost and manufacturing time may be reduced compared to the case of using vias.

In an example, the magnetoresistive elements MR1 and MR2 may include additional layers for various purposes. For example, they may further include a heat conduction control layer having low thermal conductivity (e.g., oxide-based layer, $Al_2O_3$ layer, $SiO_2$ layer, $TiO_2$ layer) so that heat may sufficiently stay in the first magnetoresistive element MR1 and a layer (e.g., a layer including a diamagnetic material (e.g., PtMn or IrMn)) for further enhancing the magnetization direction fixing effect of the lower magnetic layers LM1 and LM2. The layer for further enhancing the magnetization direction fixing effect of the lower magnetic layers LM1 and LM2 may be provided between the lower magnetic layers LM1 and LM2 and the lower conductive lines 122, 124, and 126 to be described later.

The first lower conductive line 122, the second lower conductive lines 124, and a third lower conductive line 126 may be provided on the first insulating layer 108. The first lower conductive line 122, the second lower conductive lines 124, and the third lower conductive line 126 may extend along the upper surface of the first insulating layer 108. The first lower conductive line 122 may extend from a region between the first via 112 and a second insulating layer 132 to be described later to a region between the first lower magnetic layer LM1 of the first magnetoresistive unit MU1 and the first insulating layer 108. The first lower conductive line 122 may electrically connect the first lower magnetic layer LM1 of the first magnetoresistive unit MU1 to the first via 112. Accordingly, the first pad 102 and the first lower magnetic layer LM1 of the first magnetoresistive unit MU1 may be electrically connected to each other by the first via 112 and the first lower conductive line 122.

The second lower conductive lines 124 may electrically connect a second lower magnetic layer LM2 of the first magnetoresistive unit MU1 to a first lower magnetic layer LM1 of the second magnetoresistive unit MU2 and electrically connect the second lower magnetic layer LM2 of the second magnetoresistive unit MU2 to a first lower magnetic layer LM1 of the third magnetoresistive unit MU3, respectively. One of the second lower conductive lines 124 may extend from a region between the second lower magnetic layer LM2 of the first magnetoresistive unit MU1 and the first insulating layer 108 to a region between the first lower magnetic layer LM1 of the second magnetoresistive unit MU2 and the first insulating layer 108. The other of the second lower conductive lines 124 may extend from a region between the second lower magnetic layer LM2 of the second magnetoresistive unit MU2 and the first insulating layer 108 to a region between the first lower magnetic layer LM1 of the third magnetoresistive unit MU3 and the first insulating layer 108. Because the second lower conductive lines 124 are provided between adjacent magnetoresistive units, the number of the second lower conductive lines 124 may be one fewer than the number of the magnetoresistive units MU1, MU2, and MU3.

The third lower conductive line 126 may extend from a region between the second lower magnetic layer LM2 of the third magnetoresistive unit MU3 and the first insulating layer 108 to a region between the second via 114 and a second insulating layer 132 to be described later. The third lower conductive line 126 may electrically connect the second lower magnetic layer LM2 of the third magnetoresistive unit MU3 to the second via 114. Accordingly, the second pad 104 and the second lower magnetic layer LM2 of the third magnetoresistive unit MU3 may be electrically connected to each other. The first to third lower conductive lines 122, 124, and 126 may include an electrically conductive material. For example, the first to third lower conductive lines 122, 124, and 126 may include at least one of titanium nitride (TiN), platinum (Pt), palladium (Pd), tungsten (W), titanium (Ti), aluminum (Al), nickel (Ni), a nickel-chromium (NiCr) alloy, copper (Cu), and gold (Au). In an example, lower electrodes may be respectively interposed between the lower magnetic layers LM1 and LM2 and the first insulating layer 108, and the first to third lower conductive lines 122, 124, and 126 may contact the lower electrodes.

The second insulating layer 132 may be provided on the first insulating layer 108. The second insulating layer 132 may surround side surfaces of the magnetoresistive elements MR1 and MR2. The thickness of the second insulating layer 132 may be about 0.1 μm or less. The second insulating layer 132 may prevent heat from being dissipated from the first magnetoresistive elements MR1 too quickly. In other words, the second insulating layer 132 may be configured to sufficiently retain heat in the first magnetoresistive elements MR1. The second insulating layer 132 may expose upper portions of the first magnetoresistive elements MR1. In an example, an upper surface of the second insulating layer 132 may be coplanar with the upper surfaces of the magnetoresistive elements MR1 and MR2. The second insulating layer 132 may cover the first lower conductive line 122, the second lower conductive lines 124, and the third lower conductive line 126. The second insulating layer 132 may include an insulating material. For example, the second insulating layer 132 may include oxide, nitride, or a combination thereof. For example, the second insulating layer 132 may include at least one of $SiO_2$, $Al_2O_3$, $HfO_2$, and $Si_xN_y$.

Upper conductive lines 134 may be provided on the second insulating layer 132. The upper conductive lines 134 may electrically connect the first upper magnetic layer UM1 to the second upper magnetic layer UM2 in each of the first to third magnetoresistive units MU1, MU2, and MU3. The upper conductive lines 134 may extend from a region between the first upper magnetic layer UM1 and a third insulating layer 142 to be described later to a region between the second upper magnetic layer UM2 and the third insulating layer 142 in each of the first to third magnetoresistive units MU1, MU2, and MU3. The number of upper conductive lines 134 may be the same as the number of magnetoresistive units MU1, MU2, and MU3. The upper conductive lines 134 may include an electrically conductive material. For example, the upper conductive lines 134 may include at least one of a titanium nitride (TiN), platinum (Pt), palladium (Pd), tungsten (W), titanium (Ti), aluminum (Al), nickel (Ni), a nickel-chromium (NiCr) alloy, copper (Cu), and gold (Au). In an example, upper electrodes may be provided on the upper magnetic layers UM1 and UM2, and the upper conductive lines 134 may be electrically connected to the upper electrodes.

A third insulating layer 142 may be provided on the second insulating layer 132. The third insulating layer 142 may cover the upper conductive lines 134. The third insulating layer 142 may include an insulating material. For example, the third insulating layer 142 may include oxide, nitride, or a combination thereof. For example, the third insulating layer 108 may include at least one of $SiO_2$, $Al_2O_3$, $HfO_2$, and $Si_xN_y$.

Heat transfer vias 144 may be provided on the first magnetoresistive elements MR1, respectively. The heat transfer vias 144 may effectively transfer heat generated by the light absorption layer 152, which will be described later, to the first magnetoresistive elements MR1. The heat transfer vias 144 may include a material having high thermal conductivity and low electrical conductivity. For example, the heat transfer vias 144 may include SiNx. The heat transfer vias 144 may pass through the third insulating layer 142. For example, the heat transfer vias 144 may extend in a direction perpendicular to the upper surface of the substrate 100. Although the heat transfer vias 144 are shown disposed on the upper conductive lines 134, this is only an example. In another example, the heat transfer vias 144 may directly contact the first upper magnetic layers UM1.

The light absorption layer 152 may be provided on the third insulating layer 142. The light absorption layer 152 may absorb light to generate heat. For example, the light absorption layer 152 may selectively absorb long-wavelength infrared rays. In an example, the light absorption layer 152 may include a SiNx layer, a NiCr layer, and a SiNx layer sequentially stacked in a direction perpendicular to the upper surface of the substrate 100. The thickness of the light absorption layer 152 may be about 3 µm to about 5 µm. The thickness ratio of the SiNx layer, the NiCr layer, and the SiNx layer may be determined as necessary. A separation distance between the light absorption layer 152 and the magnetoresistive elements MR1 and MR2 may be about 1 µm or less.

The disclosure may provide the long wavelength infrared sensor 10 in which heat is effectively transferred to the first magnetoresistive elements MR1 and a manufacturing cost and manufacturing time are reduced.

The first magnetoresistive elements MR1 may be connected in series by the second magnetoresistive elements MR2.

Hereinafter, the operation method of the long wavelength infrared sensor 10 is described.

Figure 4:
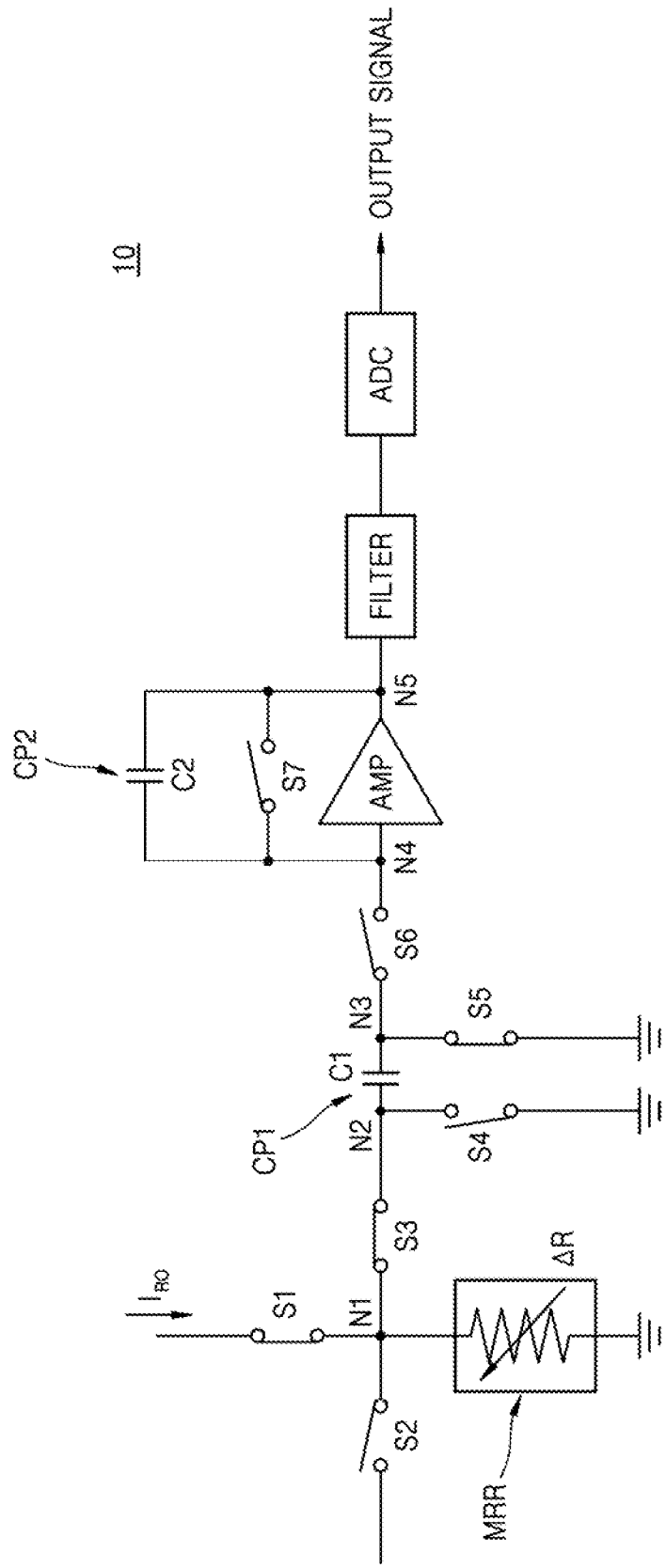
FIGS. 4 and 5 are circuit diagrams for explaining a readout operation method of the long wavelength infrared sensor of FIG. 3.
Figure 5:
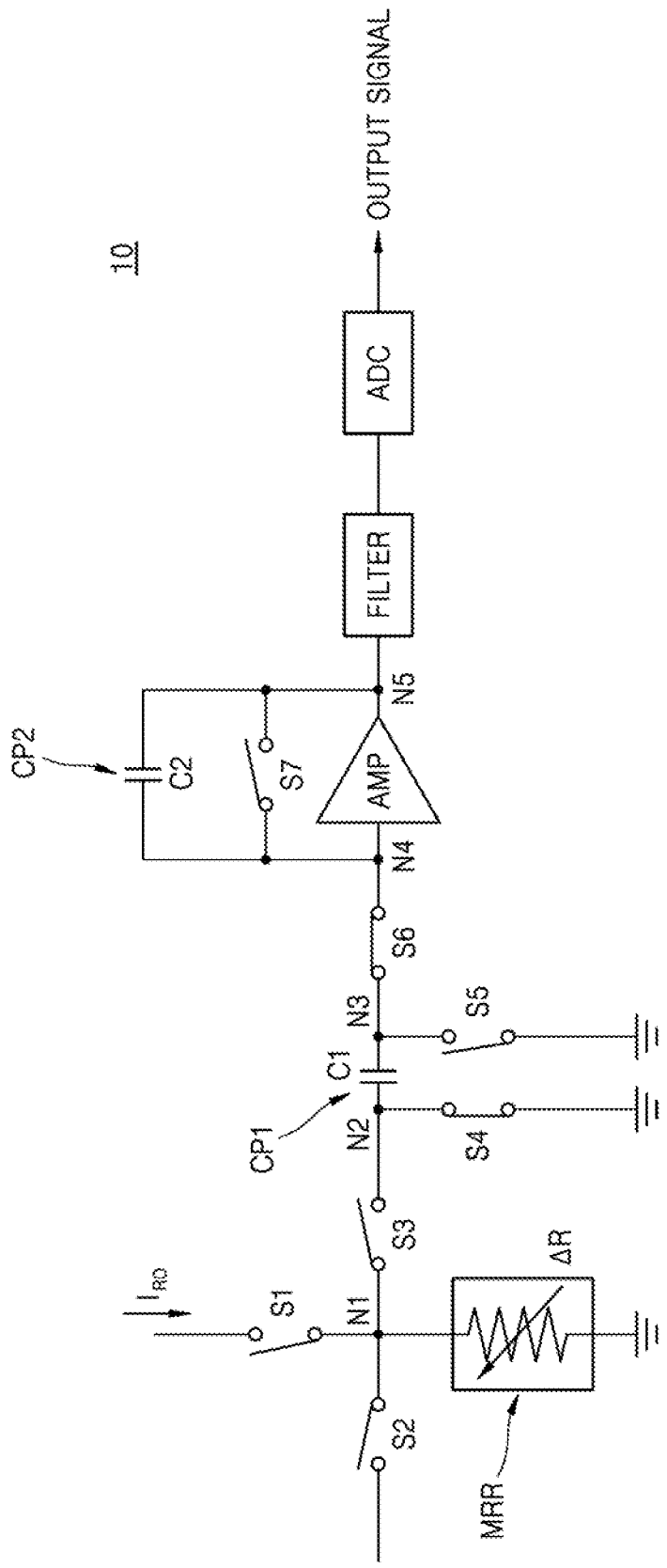
Figure 6:
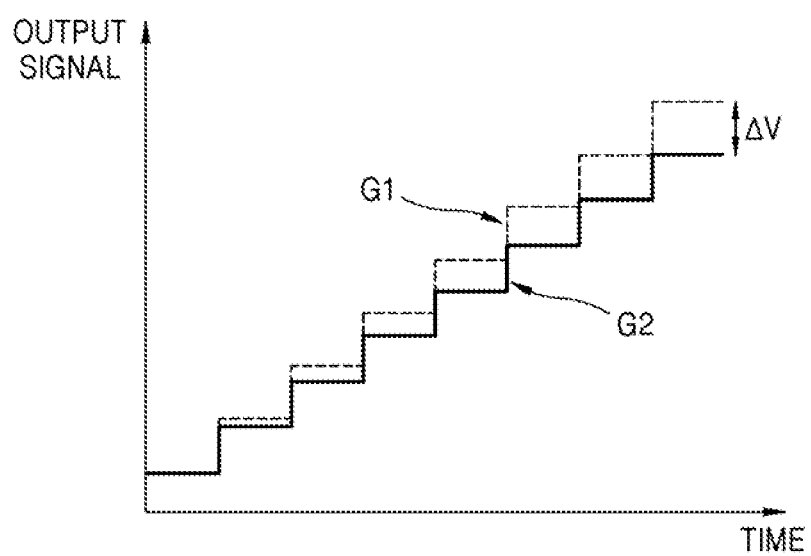
FIG. 6 shows graphs of output voltages depending on temperatures of magnetoresistive elements.

FIGS. 4 and 5 are circuit diagrams for explaining a readout operation method of the long wavelength infrared sensor of FIG. 3. FIG. 6 shows graphs of output voltages depending on temperatures of magnetoresistive elements.

Referring to FIG. 4, a circuit is shown during readout operation of the long wavelength infrared sensor 10. The long wavelength infrared sensor 10 may include first to seventh switches S1 to S7, a magneto resistor MRR, a first capacitor CP1, a second capacitor CP2, an operational amplifier AMP, a filter, and ADC. The fourth to seventh switches S4 to S7, the first and second capacitors CP1 and CP2, and the operational amplifier AMP may constitute a switched capacitor integrator. The capacitances of the first capacitor CP1 and the second capacitor CP2 are expressed as C1 and C2, respectively. The resistance of the magneto resistor MRR is expressed as $\Delta R$.

The first, third, and fifth switches S1, S3, and S5 may be closed and the second, fourth, sixth, and seventh switches S2, S4, S6, and S7 may be opened, for a predetermined time depending on a signal generated by the timing controller 1010 described with reference to FIG. 1. A readout current $I_{RO}$ flowing from the first switch S1 to a first node N1 may be applied. For example, the readout current $I_{RO}$ may be applied from a current source and have a constant magnitude. The readout current $I_{RO}$ may pass through the magneto resistor MRR. The magneto resistor MRR may represent an equivalent resistor of the magnetoresistive elements MR1 and MR2 described with reference to FIG. 3. The resistance of the magneto resistor MRR may be substantially equal to the sum of the resistances of the magnetoresistive elements MR1 and MR2. Because the first magnetoresistive elements MR1 have temperature-dependent resistance, the magneto resistor MRR may be expressed as a variable resistance. The readout current $I_{RO}$ may be applied to the first pad 102 illustrated in FIG. 3 to sequentially pass through the first to third magnetoresistive units MU1, MU2, and MU3 and the second pad 104. Because one end of the magneto resistor MRR is grounded, a first voltage V1 applied to the first node N1 may be as follows.

$$V1 = \Delta R \times I_{RO}$$

The first voltage V1 may be substantially the same as an output signal generated from the magnetoresistive elements MR1 and MR2 described with reference to FIGS. 1 and 2. Because a third node N3 side of the first capacitor CP1 is grounded, the voltage difference across the first capacitor CP1 may be substantially equal to the first voltage V1. A charge having an amount defined by the product of C1 and V1 may be charged in the first capacitor CP1.

Referring to FIG. 5, the first, second, third, fifth, and seventh switches S1, S2, S3, S5, and S7 are opened and the fourth and sixth switches S4 and S6 may be closed, depending on the signal of the timing controller 1010. Charges stored in the first capacitor CP1 during the configuration shown, e.g., in FIG. 4 may move to the second capacitor CP2. A second voltage V2 applied to a fifth node N5 may be as follows.

$$V2 = \frac{C1}{C2} \times V1$$

The second voltage V2 may vary discontinuously. For example, the second voltage V2 may be expressed as a step function. The second voltage V2 applied to the fifth node N5 may be an output signal of the switched capacitor integrator. A filter may remove noise from the output signal applied to the fifth node N5. However, if necessary, the filter may not be provided.

The output signal passing through the filter may be provided to an ADC. The ADC may convert an output signal into a digital value and output the converted signal. The output signal output from the ADC may be a voltage signal expressed as a step function. In an example, an image processor for processing an output signal of the ADC into an image may be further provided.

The operations described with reference to FIG. 4 and the operations described with reference to FIG. 5 may be repeated at regular time intervals for a preset time depending on a signal from the timing controller 1010. The second voltage V2 applied to the fifth node N5 may increase discontinuously whenever the number of repetitions increases. Accordingly, the output signal of the ADC may also increase discontinuously. Hereinafter, an output signal of the ADC depending on the temperature of the magnetoresistive elements MR1 and MR2 will be described.

Referring to FIG. 6, a first graph G1 and a second graph G2 are shown. The first graph G1 represents an output signal of the ADC while a read operation is performed when the magnetoresistive elements MR1 and MR2 have a low temperature. The second graph G2 represents an output signal of the ADC while a read operation is performed when the magnetoresistive elements MR1 and MR2 have a high temperature. As described above, the first and second graphs G1 and G2 have a shape that discontinuously increases as time passes. At the initial stage of the read operation, the difference $\Delta V$ between the first graph G1 and the second graph G2 (that is, the difference in the magnitude of the output signal) is small, but when the charging of the second capacitor CP2 is repeated several times, the difference $\Delta V$ between the first graph G1 and the second graph G2 is increased. Because the temperature of the magnetoresistive elements MR1 and MR2 is increased by the heat emitted from the light absorption layer 152, $\Delta V$ may be a difference between output signals when the light absorption layer 152 described with reference to FIG. 3 does not absorb long-wavelength infrared rays and when long-wavelength infrared rays are absorbed.

Because $\Delta V$ is related to the amount of change in temperature of the magnetoresistive elements MR1 and MR2 and the amount of change in temperature of the magnetoresistive elements MR1 and MR2 is related to the intensity of the long-wavelength infrared light absorbed by the light absorption layer 152, intensity information of long-wavelength infrared rays incident on the long wavelength infrared sensor 10 may be obtained based on ΔV. In an example, detecting the intensity of long-wavelength infrared light from ΔV may be performed by the output circuit 1030 described with reference to FIG. 1.

Figure 7:
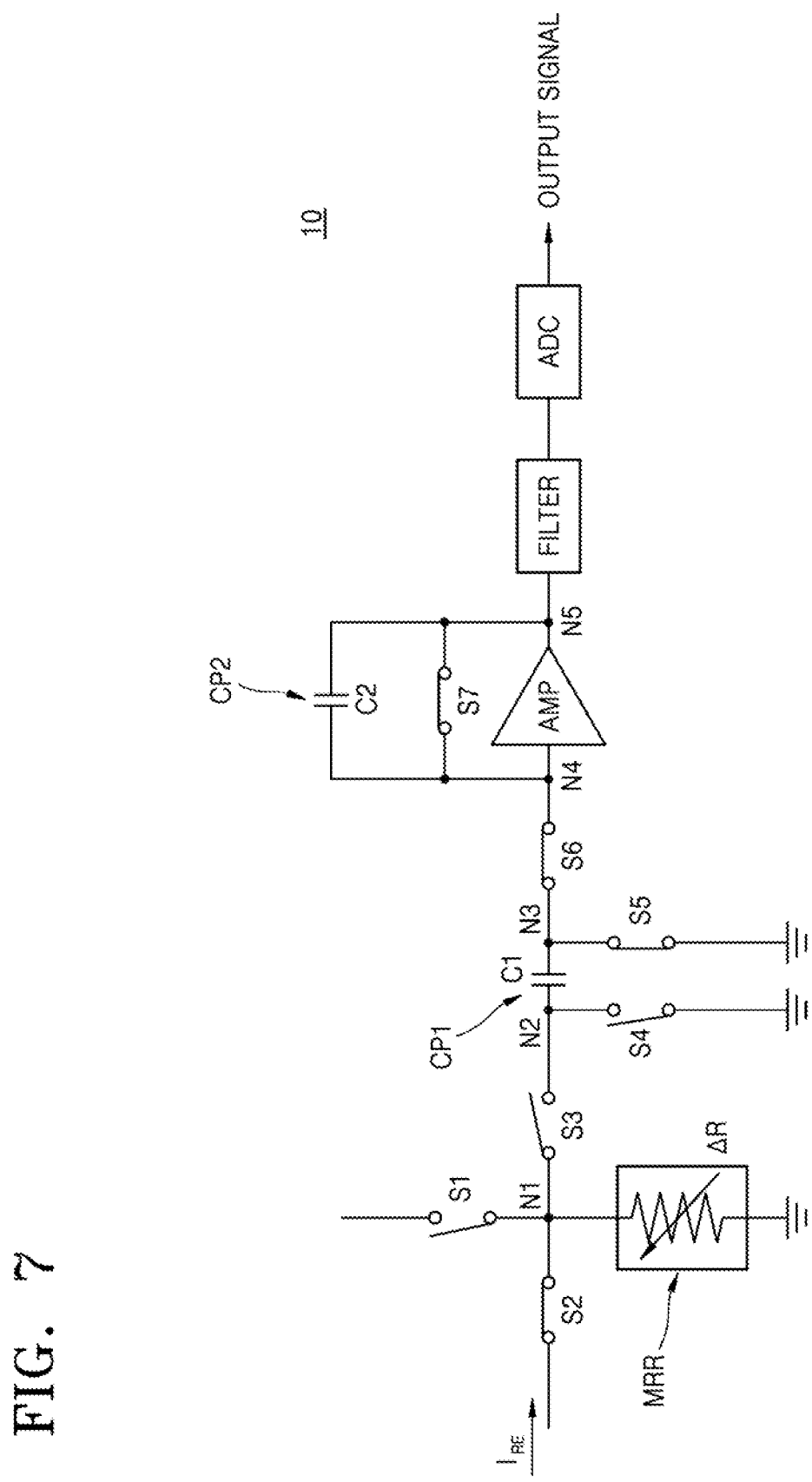
FIG. 7 is a circuit diagram for explaining a reset operation method of the long wavelength infrared sensor of FIG. 3.

FIG. 7 is a circuit diagram for explaining a reset operation method of the long wavelength infrared sensor of FIG. 3. For brevity of description, descriptions substantially the same as those given with reference to FIGS. 4 and 5 may not be given.

Referring to FIG. 7, depending on the signal of the timing controller 1010, the first, third, and fourth switches S1, S3, and S4 are opened, and the second, fifth, sixth, and seventh switches S2, S5, S6, and S7 may be closed. A reset current IRE may be applied to the first node N1 through the second switch S2. The reset current IRE may pass through the magneto resistor MRR. For example, the reset current IRE may be applied to the first pad 102 described with reference to FIG. 3 to pass through the first and second magnetoresistive elements MR1 and MR2. The reset current IRE may return the magnetization direction of the first upper magnetic layers UM1 misaligned by heat while the readout operation is performed to be antiparallel to the magnetization direction of the first lower magnetic layers LM1. Because the fifth, sixth, and seventh switches S5, S6, and S7 are closed, both ends of the second capacitor CP2 may be grounded. Accordingly, charges stored in the second capacitor CP2 may be removed.

The reset operation may be performed for a predetermined time, and the readout operation described with reference to FIGS. 4 and 5 may be performed again. The readout operation and the reset operation are repeatedly performed, so that the long wavelength infrared sensor 10 may detect the intensity of the long-wavelength infrared.

FIGS. 8 to 15 are cross-sectional views illustrating a method of manufacturing the long wavelength infrared sensor of FIG. 3. The shape and location of components of the long wavelength infrared sensor may be substantially the same as described with reference to FIG. 3.

Figure 8:
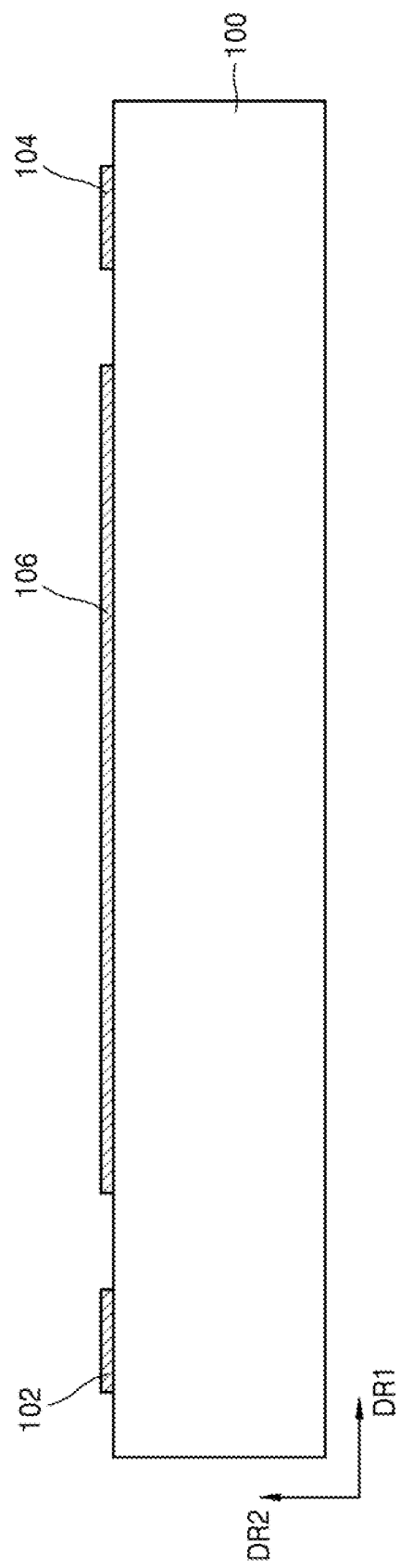
FIGS. 8 to 15 are cross-sectional views illustrating a method of manufacturing the long wavelength infrared sensor of FIG. 3.

Referring to FIG. 8, a first pad 102, a second pad 104, and a reflective layer 106 may be formed on a substrate 100. The substrate 100 may be a semiconductor substrate on which electronic elements and wirings are formed. For example, the substrate 100 may include silicon (Si), germanium (Ge), or silicon germanium (SiGe). The substrate 100 may be an ROIC substrate for controlling the long wavelength infrared sensor 10.

Forming the first pad 102, the second pad 104, and the reflective layer 106 may include depositing an electrically conductive material on the substrate 100 and then patterning the deposited electrically conductive material. For example, the electrically conductive materials may include at least one of titanium nitride (TiN), platinum (Pt), palladium (Pd), tungsten (W), titanium (Ti), aluminum (Al), nickel (Ni), molybdenum (Mo), copper (Cu), and gold (Au).

Figure 9:
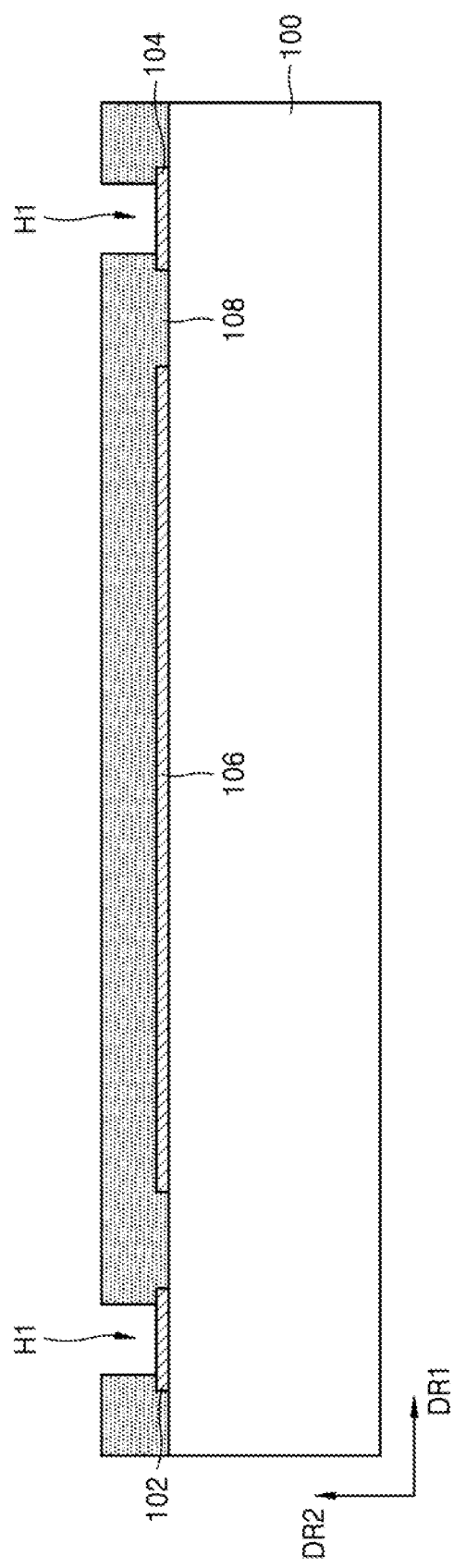

Referring to FIG. 9, a first insulating layer 108 may be formed on the substrate 100. The first insulating layer 108 may be formed by processes of depositing an insulating material on the substrate 100 and then patterning the deposited insulating material to form first holes H1 exposing the first pad 102 and the second pad 104. For example, the insulating material may include at least one of $SiO_2$, $Al_2O_3$, $HfO_2$, and $Si_xN_y$.

Figure 10:
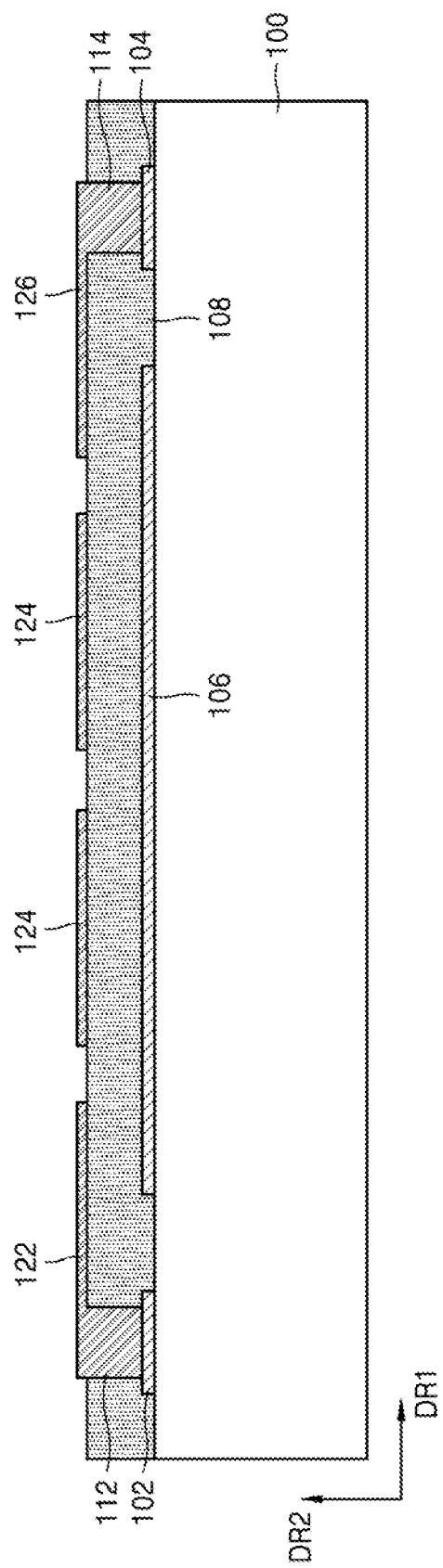

Referring to FIG. 10, a first via 112, a first lower conductive line 122, second lower conductive lines 124, a third lower conductive line 126, and a second via 114 may be formed. For example, an electrically conductive material is deposited to cover the upper surface of the first insulating layer 108 and fill the first holes (H1 in FIG. 9) of the first insulating layer 108 exposing the first pad 102 and the second pad 104, so that the first via 112, the first lower conductive line 122, the second lower conductive lines 124, the third lower conductive line 126, and the second via 114 may be formed. For example, the electrically conductive material may include at least one of a titanium nitride layer (TiN), platinum (Pt), palladium (Pd), tungsten (W), titanium (Ti), aluminum (Al), nickel (Ni), molybdenum (Mo), copper (Cu), and gold (Au).

Figure 11:
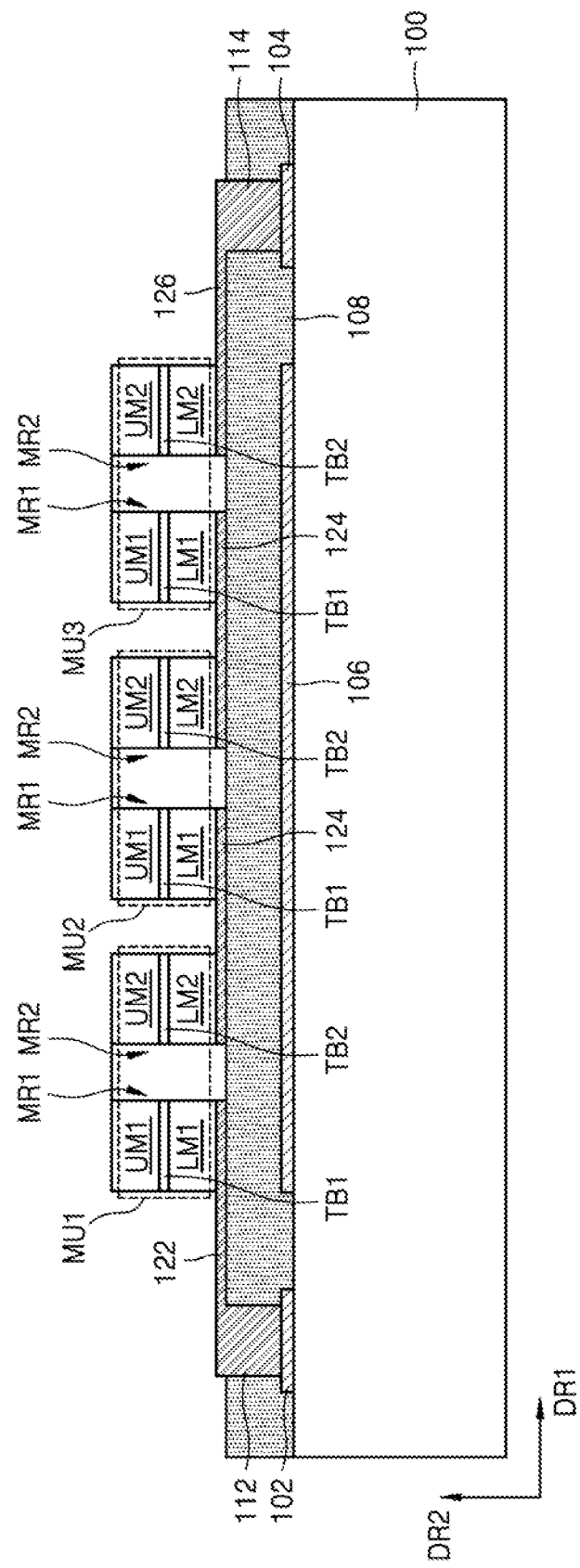

Referring to FIG. 11, first magnetoresistive elements MR1 and second magnetoresistive elements MR2 may be formed on the first lower conductive line 122, the second lower conductive lines 124, and the third lower conductive line 126. For example, after a lower magnetic material, a tunneling barrier material, and an upper magnetic material are sequentially deposited on the first insulating layer 108, the deposited materials are patterned to form the first magnetoresistive elements MR1 and the second magnetoresistive elements MR2 may be formed. The lower magnetic material, the tunneling barrier material, and the upper magnetic material may be substantially the same as materials of the lower magnetic layer, the tunneling barrier layer, and the upper magnetic layer described with reference to FIG. 3, respectively.

A first magnetoresistive unit MU1, a second magnetoresistive unit MU2, and a third magnetoresistive unit MU3 may be defined. Each of the first to third magnetoresistive units MU1, MU2, and MU3 may include a first magnetoresistive element MR1 and a second magnetoresistive element MR2. The first magnetoresistive element MR1 of the first magnetoresistive unit MU1 may be formed on the first lower conductive line 122, and the second magnetoresistive element MR2 of the first magnetoresistive unit MU1 may be formed on one of the second lower conductive lines 124. The first magnetoresistive element MR1 of the second magnetoresistive unit MU2 may be formed on one of the second lower conductive lines 124. The second magnetoresistive element MR2 of the second magnetoresistive unit MU2 may be formed on the other one of the second lower conductive lines 124. The first magnetoresistive element MR1 of the third magnetoresistive unit MU3 may be formed on the other one of the second lower conductive lines 124. The second magnetoresistive element MR2 of the third magnetoresistive unit MU3 may be formed on the third lower conductive line 126.

Figure 12:
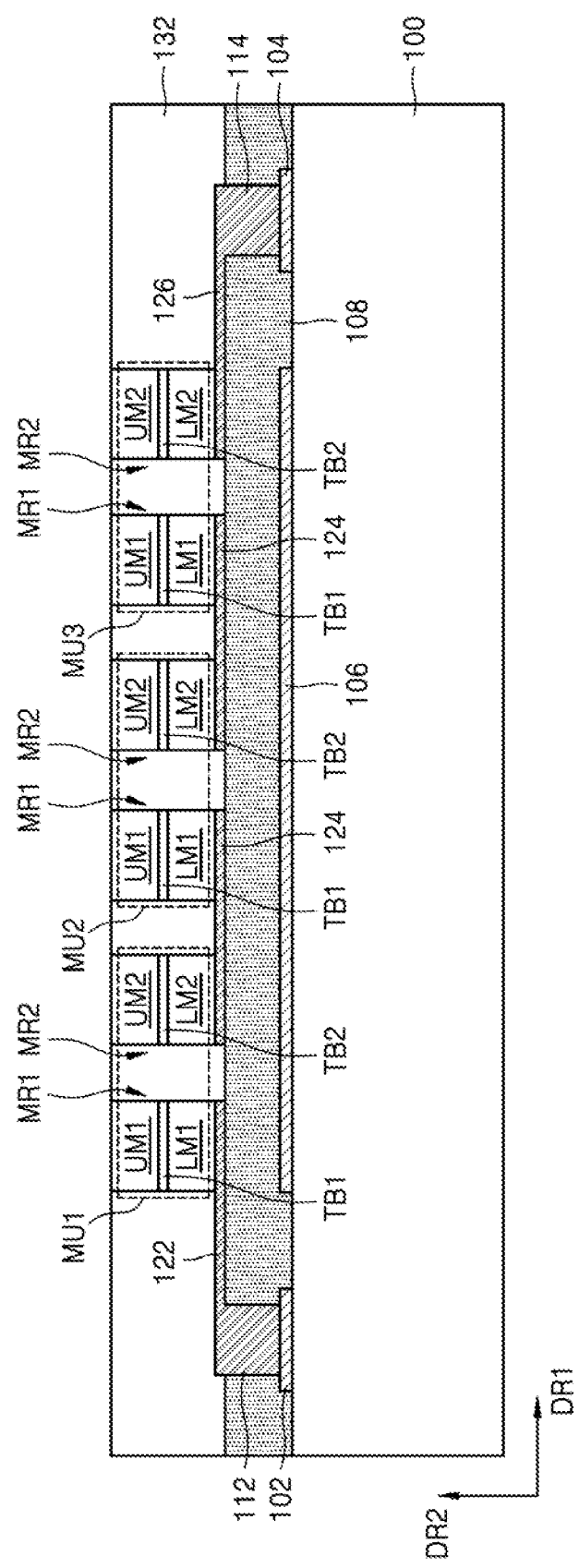

Referring to FIG. 12, a second insulating layer 132 may be formed. For example, the formation of the second insulating layer 132 may include a process of depositing an insulating material on the first insulating layer 108 and a process of exposing top surfaces of the first and second magnetoresistive elements MR1 and MR2 by performing a planarization process (e.g., a chemical mechanical planarization (CMP) process) on the deposited insulating material. For example, the insulating material may include at least one of $SiO_2$, $Al_2O_3$, $HfO_2$, and $Si_xN_y$.

Figure 13:
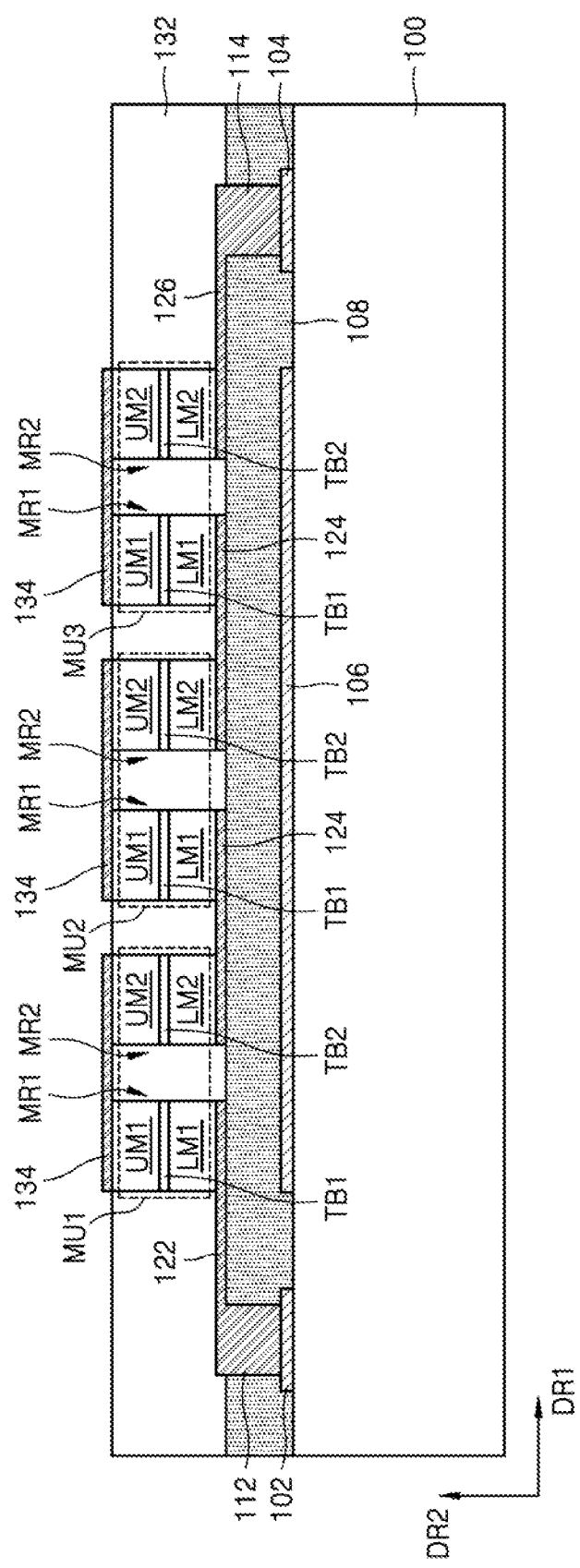

Referring to FIG. 13, upper conductive lines 134 may be formed on the second insulating layer 132. For example, after an electrically conductive material is deposited on the second insulating layer 132 and the first and second magnetoresistive elements MR1 and MR2, the deposited electrically conductive material is patterned to form upper conductive lines 134. The upper conductive lines 134 extend from a region on the first magnetoresistive element MR1 to a region on the second magnetoresistive element MR2 in the first to third magnetoresistive units MU1, MU2, and MU3, respectively. For example, the electrically conductive material may include at least one of a titanium nitride (TiN), platinum (Pt), palladium (Pd), tungsten (W), titanium (Ti), aluminum (Al), nickel (Ni), molybdenum (Mo), copper (Cu), and gold (Au).

Figure 14:
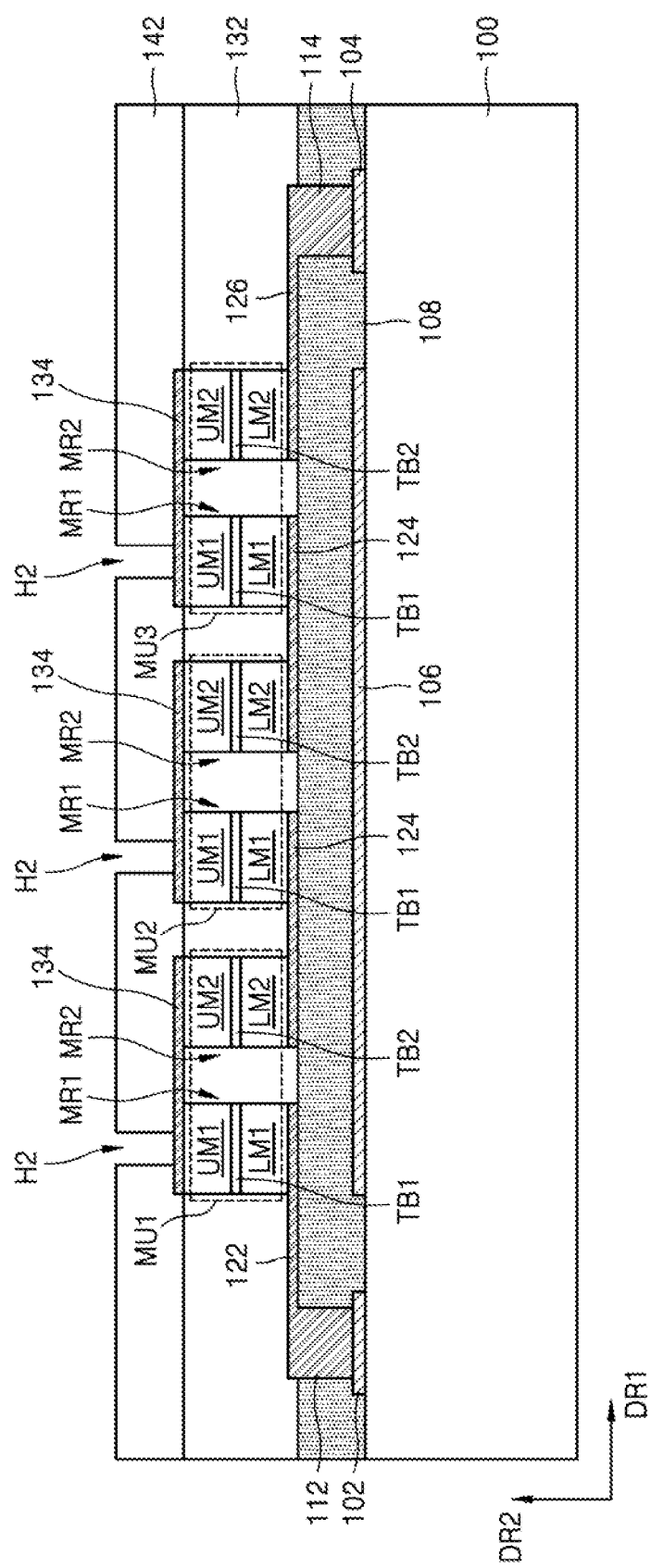

Referring to FIG. 14, a third insulating layer 142 may be formed on the second insulating layer 132. For example, the formation of the third insulating layer 142 may include a process of depositing an insulating material on the second insulating layer 132 and a process of patterning the deposited insulating material to form second holes H2 respectively exposing the upper conductive lines 134. For example, the insulating material may include at least one of $SiO_2$, $Al_2O_3$, $HfO_2$, and $Si_xN_y$. The second holes H2 may expose portions of upper surfaces of the upper conductive lines 134. The second holes H2 may be respectively formed on the first magnetoresistive elements MR1. In other words, the second holes H2 may overlap the first magnetoresistive elements MR1 in the second direction DR2, respectively.

Figure 15:
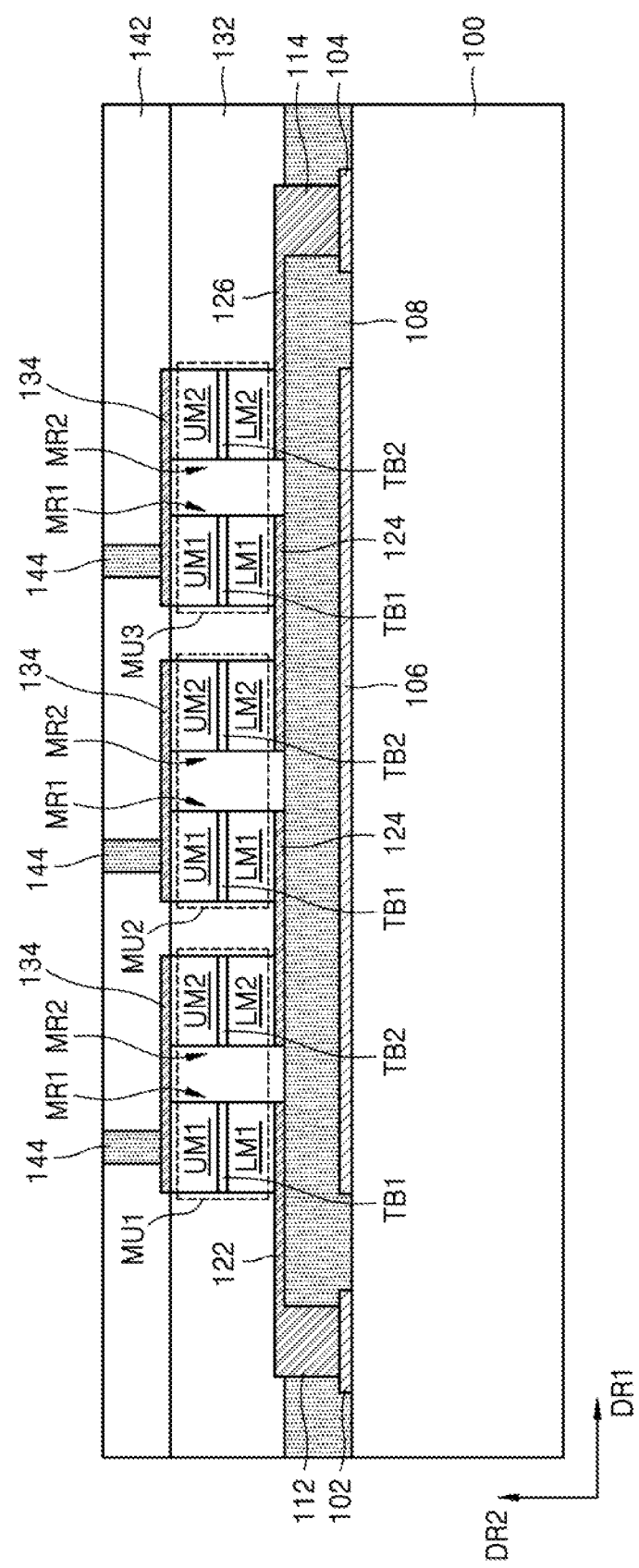

Referring to FIG. 15, heat transfer vias 144 may be respectively formed in the second holes (H2 of FIG. 14) exposing the upper conductive lines 134. For example, after a material having high thermal conductivity is deposited on the third insulating layer 142 to fill the second holes (H2 in FIG. 14), the heat transfer vias 144 may be formed by planarizing the deposited material to expose the third insulating layer 142. For example, the material having high thermal conductivity may be SiNx.

Referring back to FIG. 3, a light absorption layer 152 may be formed on the third insulating layer 142. For example, the light absorption layer 152 may be formed by sequentially depositing a SiNx layer, a NiCr layer, and a SiNx layer on the third insulating layer 142 to have a multilayer structure. In an example, the heat transfer vias 144 and the light absorption layer 152 described with reference to FIG. 15 may be formed by the same process. For example, in a process of filling the second holes (H2 in FIG. 14) with a material having high thermal conductivity (e.g., SiNx), a material layer (e.g., SiNx layer) deposited on the third insulating layer 142 may be used as the lowermost layer of the light absorption layer 152. Then, the heat transfer vias 144 and a lowermost layer of the light absorption layer 152 form a single structure.

According to the disclosure, because the second magnetoresistive elements MR2 electrically connecting the first magnetoresistive elements MR1 to each other are formed by the same process as the first magnetoresistive elements MR1, a manufacturing time and manufacturing cost of the long wavelength infrared sensor 10 may be reduced compared to forming separate vias instead of the second magnetoresistive elements MR2.

Figure 16:
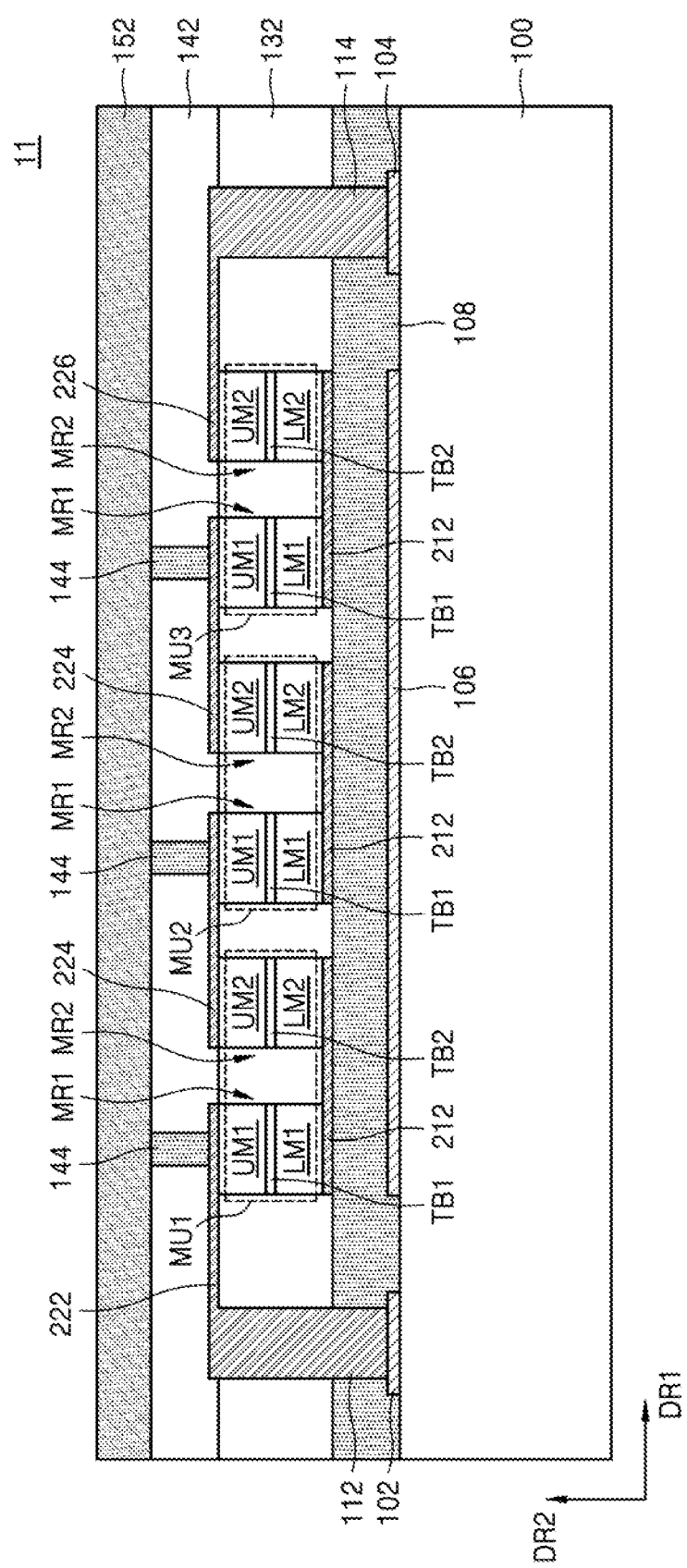
FIG. 16 is a cross-sectional view of a long wavelength infrared sensor according to an embodiment.

FIG. 16 is a cross-sectional view of a long wavelength infrared sensor according to an example embodiment. For brevity of explanation, differences from description given with reference to FIG. 3 are described.

Referring to FIG. 16, a long wavelength infrared sensor 11 may be provided. Unlike the description with reference to FIG. 3, a first pad 102 may be electrically connected to the first upper magnetic layer UM1 of the first magnetoresistive unit MU1. A second pad 104 may be electrically connected to the second upper magnetic layer UM2 of the third magnetoresistive unit MU3. A first via 112 may pass through the first insulating layer 108 and the second insulating layer 132 to be electrically connected to the first pad 102 and a first upper conductive line 222 to be described later. A second via 114 may pass through the first insulating layer 108 and the second insulating layer 132 to be electrically connected to the second pad 104 and a third upper conductive line 226 to be described later.

For the series connection of the first magnetoresistive elements MR1, instead of the first to third lower conductive lines 122, 124, 126 and the upper conductive line 134 of FIG. 3, lower conductive lines 212, a first upper conductive line 222, second upper conductive lines are 224, and a third upper conductive line 226 may be provided. The first upper conductive line 222, the second upper conductive lines 224, and the third upper conductive line 226 may be provided on the second insulating layer 132.

The first upper conductive line 222 may extend from a region between the first via 112 and the second insulating layer 132 to a region between the first upper magnetic layer UM1 of the first magnetoresistive unit MU1 and the third insulating layer 142. The first upper conductive line 222 may electrically connect the first upper magnetic layer UM1 of the first magnetoresistive unit MU1 to the first via 112. Accordingly, the first pad 102 and the first upper magnetic layer UM1 of the first magnetoresistive unit MU1 may be electrically connected to each other by the first via 112 and the first upper conductive line 222.

The second upper conductive lines 224 may electrically connect the second upper magnetic layer UM2 of the first magnetoresistive unit MU1 to the first upper magnetic layer UM1 of the second magnetoresistive unit MU2, and electrically connect the second upper magnetic layer UM2 of the second magnetoresistive unit MU2 to the first upper magnetic layer UM1 of the third magnetoresistive unit MU3, respectively. One of the second upper conductive lines 224 may extend from a region between the second upper magnetic layer UM2 of the first magnetoresistive unit MU1 and the third insulating layer 142 to a region between the first upper magnetic layer UM1 of the second magnetoresistive unit MU2 and the third insulating layer 142. The other of the second upper conductive lines 224 may extend from a region between the second upper magnetic layer UM2 of the second magnetoresistive unit MU2 and the third insulating layer 142 to a region between the first upper magnetic layer UM1 of the third magnetoresistive unit MU3 and the third insulating layer 142. Because the second upper conductive lines 224 are provided between adjacent magnetoresistive units, the number of second upper conductive lines 224 may be one fewer than the number of magnetoresistive units.

The third upper conductive line 226 may extend from a region between the second upper magnetic layer UM2 of the third magnetoresistive unit MU3 and the third insulating layer 142 to a region between the second via 114 and the third insulating layer 142. The third upper conductive line 226 may electrically connect the second upper magnetic layer UM2 of the third magnetoresistive unit MU3 to the second via 114. Accordingly, the second pad 104 and the second upper magnetic layer UM2 of the third magnetoresistive unit MU3 may be electrically connected to each other.

The first to third upper conductive lines 222, 224, and 226 may include an electrically conductive material. For example, the first to third upper conductive lines 222, 224, and 226 may include at least one of a titanium nitride (TiN), platinum (Pt), palladium (Pd), tungsten (W), titanium (Ti), aluminum (Al), nickel (Ni), a nickel-chromium (NiCr) alloy, copper (Cu), and gold (Au). In an example, upper electrodes are respectively interposed between the upper magnetic layers UM1 and UM2 and the third insulating layer 142, and the first to third upper conductive lines 134 may contact the upper electrodes.

Lower conductive lines 212 may be provided on the first insulating layer 108. The lower conductive lines 212 may electrically connect the first lower magnetic layer LM1 to the second lower magnetic layer LM2 in each of the first to third magnetoresistive units MU1, MU2, and MU3. The lower conductive lines 212 may extend from a region between the first lower magnetic layer LM1 and the first insulating layer 108 to a region between the second lower magnetic layer LM2 and the first insulating layer 108 in each of the first to third magnetoresistive units MU1, MU2, and MU3. The number of lower conductive lines 212 may be equal to the number of magnetoresistive units MU1, MU2, and MU3. The lower conductive lines 212 may include an electrically conductive material. For example, the lower conductive lines 212 may include at least one of a titanium nitride (TiN), platinum (Pt), palladium (Pd), tungsten (W), titanium (Ti), aluminum (Al), nickel (Ni), a nickel-chromium (NiCr) alloy, copper (Cu), and gold (Au). In an example, lower electrodes may be respectively provided between the lower magnetic layers LM1 and LM2 and the first insulating layer 108, and the lower conductive lines 212 may be electrically connected to the lower electrodes.

The disclosure may provide a long wavelength infrared sensor 11 that effectively transfers heat to the first magnetoresistive elements MR1 and reduces manufacturing cost and manufacturing time.

Figure 17:
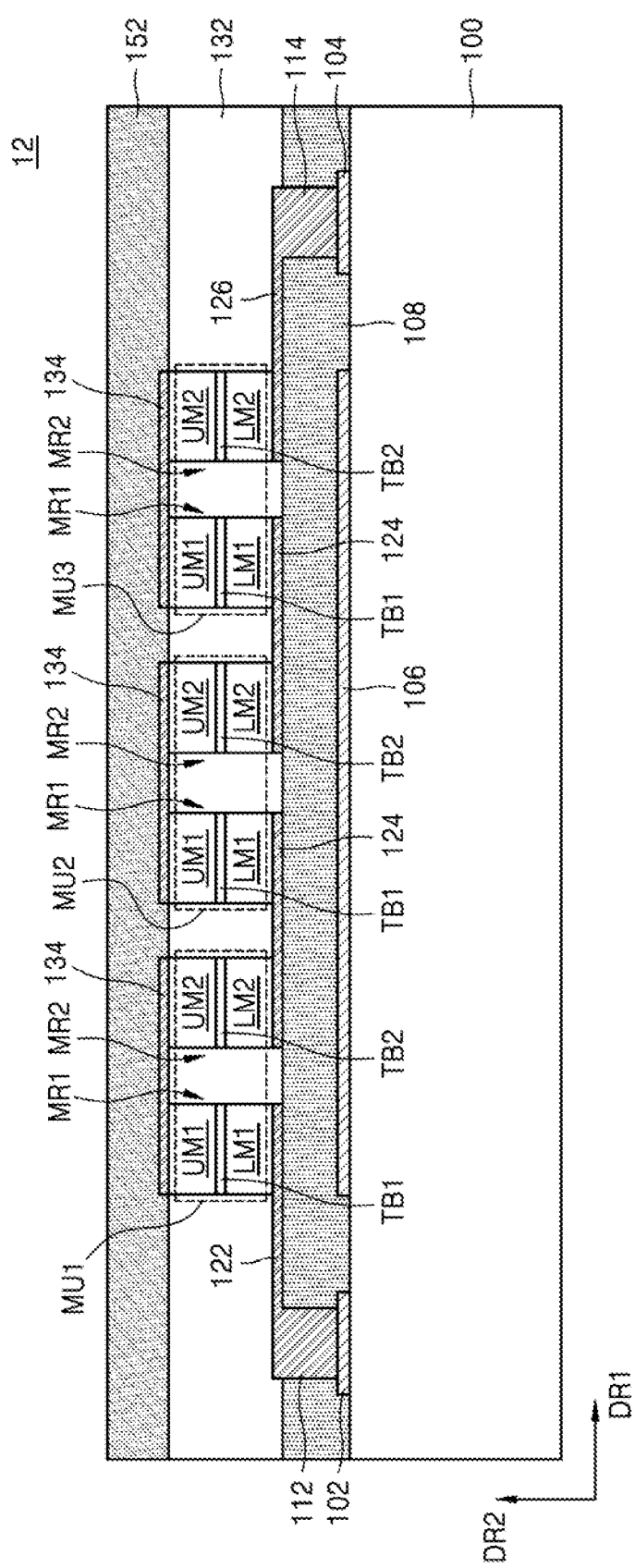
FIG. 17 is a cross-sectional view of a long wavelength infrared sensor according to an embodiment.

FIG. 17 is a cross-sectional view of a long wavelength infrared sensor according to an example embodiment. For brevity of explanation, differences from that described with reference to FIG. 3 are described.

Referring to FIG. 17, a long wavelength infrared sensor 12 may be provided. Unlike described with reference to FIG. 3, the long wavelength infrared sensor 12 may not include the third insulating layer 142 and the heat transfer vias 144 described with reference to FIG. 3. Accordingly, the light absorption layer 152 may be provided directly on the second insulating layer 132 and the upper conductive lines 134. The light absorption layer 152 may be in contact with the second insulating layer 132 and the upper conductive lines 134. In an example, each of the upper conductive lines 134 covers a portion of the upper surface of each of the upper magnetic layers UM1 and UM2, and the light absorption layer 152 may cover another portion of the upper surface not covered by the upper conductive lines 134.

The disclosure may provide a long wavelength infrared sensor 12 that effectively transfers heat to the first magnetoresistive elements MR1 and reduces manufacturing cost and manufacturing time.

Figure 18:
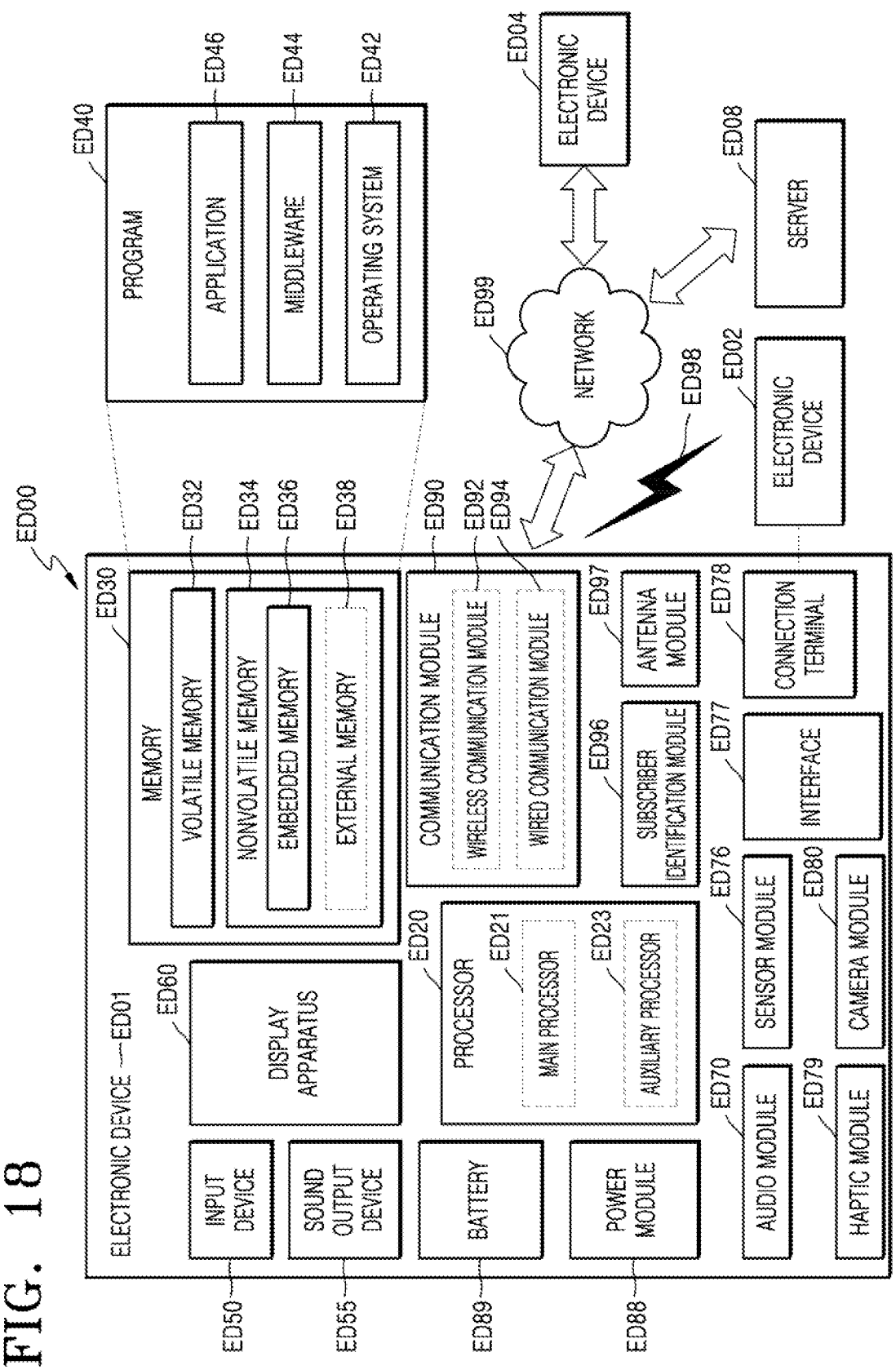
FIG. 18 is a block diagram illustrating an example of an electronic device including a long wavelength infrared sensor.

FIG. 18 is a block diagram of an example of an electronic device ED01 including a long wavelength infrared sensor.

Referring to FIG. 18, in a network environment ED00, the electronic device ED01 may communicate with another electronic device ED02 through a first network ED98 (a short-range wireless communication network, etc.) or with another electronic device ED04 and/or a server ED08 through a second network ED99 (a remote wireless communication network, etc.). The electronic device ED01 may communicate with the electronic device ED04 through the server ED08. The electronic device ED01 may include a processor ED20, a memory ED30, an input device ED50, a sound output device ED55, a display apparatus ED60, an audio module ED70, a sensor module ED76, an interface ED77, a connection terminal ED78, a haptic module ED79, a camera module ED80, a power management module ED88, a battery ED89, a communication module ED90, a subscriber identification module ED96, and/or an antenna module ED97. The electronic device ED01 may omit one or more (the display apparatus ED60, etc.) of the components or may further include other components. One or more of the components may be implemented as an integrated circuit. For example, the sensor module ED76 (a long wavelength infrared sensor, fingerprint sensor, an iris sensor, an illumination sensor, etc.) may be embedded in the display apparatus ED60 (a display, etc.). Also, when the image sensor CM30 includes a spectroscopic function, some functions (a color sensor, an illumination sensor, etc.) of the sensor module ED76 may be directly implemented in the image sensor CM30 rather than as an additional sensor module.

The processor ED20 may execute software (a program ED40, etc.) to control one or more components (hardware or software components) of the electronic device ED01, the components being connected to the processor ED20, and to perform various data processing or calculations. As part of the data processing or calculations, the processor ED20 may load a command and/or data received from other components (the sensor module ED76, the communication module ED90, etc.) into a volatile memory ED32, process the command and/or the data stored in the volatile memory ED32, and store resultant data in a nonvolatile memory ED34. The processor ED20 may include a main processor ED21 (a central processing unit (CPU), an application processor (AP), etc.) and an auxiliary processor ED23 (a graphics processing unit (GPU), an image signal processor, a sensor hub processor, a communication processor, etc.) which may independently operate or operate with the main processor ED21. The auxiliary processor ED23 may use less power than the main processor ED21 and may perform specialized functions.

When the main processor ED21 is in an inactive state (a sleep state), the auxiliary processor ED23, instead of the main processor ED21, may control functions and/or states related to one or more (the display apparatus ED60, the sensor module ED76, the communication module ED90, etc.) of the components of the electronic device ED01. Alternatively, when the main processor ED21 is in an active state (an application execution state), the auxiliary processor ED23 may perform the above operation together with the main processor ED21. The auxiliary processor ED23 (an image signal processor, a communication processor, etc.) may be implemented as part of other functionally-related components (the camera module ED80, the communication module ED90, etc.).

The memory ED30 may store various data required by the components (the processor ED20, the sensor module ED76, etc.) of the electronic device ED01. The data may include, for example, software (the program ED40, etc.), input data and/or output data of a command related to the software. The memory ED30 may include the volatile memory ED32 and/or the nonvolatile memory ED34. The volatile memory ED32 may include an embedded memory ED36 fixedly mounted in the electronic device ED01 and a detachable external memory ED38.

The program ED40 may be stored in the memory ED30 as software, and may include an operating system ED42, middleware ED44, and/or an application ED46.

The input device ED50 may receive a command and/or data to be used by the components (the processor ED20, etc.) of the electronic device ED01 from the outside (a user, etc.) of the electronic device ED01. The input device ED50 may include a microphone, a mouse, a keyboard, and/or a digital pen (a stylus pen, etc.).

The sound output device ED55 may output a sound signal to the outside of the electronic device ED01. The sound output device ED55 may include a speaker and/or a receiver. The speaker may be used for a general purpose, such as multimedia playing or recording playing, and the receiver may be used to receive an incoming call. The receiver may be coupled to the speaker as part of the speaker or may be implemented as a separate device.

The display apparatus ED60 may visually provide information to the outside of the electronic device ED01. The display apparatus ED60 may include a display, a hologram device, or a controlling circuit for controlling a projector and a corresponding device. The display apparatus ED60 may include touch circuitry configured to sense a touch operation and/or sensor circuitry (a pressure sensor, etc.) configured to measure an intensity of a force generated by the touch operation.

The audio module ED70 may convert sound into an electrical signal or an electrical signal into sound. The audio module ED70 may obtain sound via the input device ED50 or may output sound via the sound output device ED55 and/or a speaker and/or a headphone of another electronic device (the electronic device ED02, etc.) directly or wirelessly connected to the electronic device ED01.

The sensor module ED76 may sense an operation state (power, temperature, etc.) of the electronic device ED01 or an external environmental state (a user state, etc.) and generate electrical signals and/or data values corresponding to the sensed state. The sensor module ED76 may include a gesture sensor, a gyro-sensor, an atmospheric sensor, a magnetic sensor, an acceleration sensor, a grip sensor, a proximity sensor, a color sensor, an infrared (IR) sensor, a long wavelength infrared sensor, a biometric sensor, a temperature sensor, a humidity sensor, and/or an illumination sensor. The long wavelength infrared sensor may include any one of the long wavelength infrared sensors 10, 11, and 12 described above.

The interface ED77 may support one or more designated protocols to be used for the electronic device ED01 to be directly or wirelessly connected to another electronic device (the electronic device ED02, etc.). The interface ED77 may include a high-definition multimedia interface (HDMI) interface, a universal serial bus (USB) interface, an SD card interface, and/or an audio interface.

The connection terminal ED78 may include a connector, through which the electronic device ED01 may be physically connected to another electronic device (the electronic device ED02, etc.). The connection terminal ED78 may include an HDMI connector, a USB connector, an SD card connector, and/or an audio connector (a headphone connector, etc.).

The haptic module ED79 may convert an electrical signal into a mechanical stimulus (vibration, motion, etc.) or an electrical stimulus which is recognizable to a user via haptic or motion sensation. The haptic module ED79 may include a motor, a piezoelectric device, and/or an electrical stimulus device.

The camera module ED80 may capture a still image and a video. The camera module ED80 may include a lens assembly including one or more lenses, an image sensor, image signal processors, and/or flashes. The lens assembly included in the camera module ED80 may collect light emitted from an object, an image of which is to be captured.

The power management module ED88 may manage power supplied to the electronic device ED01. The power management module ED88 may be implemented as part of a power management integrated circuit (PMIC).

The battery ED89 may supply power to the components of the electronic device ED01. The battery ED89 may include a non-rechargeable primary battery, a rechargeable secondary battery, and/or a fuel battery.

The communication module ED90 may support establishment of direct (wired) communication channels and/or wireless communication channels between the electronic device ED01 and the other electronic devices (the electronic device ED02, the electronic device ED04, the server ED08, etc.) and may support communication through the established communication channels. The communication module ED90 may include one or more communication processors separately operating from the processor ED20 (the AP, etc.) and supporting direct communication and/or wireless communication. The communication module ED90 may include a wireless communication module ED92 (a cellular communication module, a short-range wireless communication module, a global navigation satellite system (GNSS) communication module, etc.) and/or a wired communication module ED94 (a local area network (LAN) communication module, a power line communication module, etc.). A corresponding communication module from among these communication modules may communicate with other electronic devices through the first network ED98 (a short-range wireless communication network, such as Bluetooth, Wifi direct, or IR data association (IrDa)) or the second network ED99 (a remote communication network, such as a cellular network, the Internet, or a computer network (a LAN, a wide area network (WAN), etc.)). Various types of communication modules described above may be integrated into a single component (a single chip, etc.) or implemented as a plurality of components (a plurality of chips). The wireless communication module ED92 may identify and authenticate the electronic device ED01 within a communication network, such as the first network ED98 and/or the second network ED99, by using subscriber information (international mobile subscriber identification (IMSI), etc.) stored in the subscriber identification module ED96.

The antenna module ED97 may transmit or receive a signal and/or power to or from the outside (other electronic devices, etc.). The antenna module ED79 may include an emitter including a conductive pattern formed on a substrate (a PCB, etc.). The antenna module ED97 may include one or more antennas. When the antenna module ED97 includes a plurality of antennas, an antenna which is suitable for a communication method used in a communication network, such as the first network ED98 and/or the second network ED99, may be selected. Through the selected antenna, signals and/or power may be transmitted or received between the communication module ED90 and the other electronic devices. In addition to the one or more antennas, another component (a radio frequency integrated circuit (RFIC), etc.) may be included in the antenna module ED97.

One or more of the components of the electronic device ED01 may be connected to one another and exchange signals (commands, data, etc.) with one another, through a communication method performed among peripheral devices (a bus, general purpose input and output (GPIO), a serial peripheral interface (SPI), a mobile industry processor interface (MIPI), etc.).

The commands or the data may be transmitted or received between the electronic device ED01 and the external electronic device ED04 via the server ED08 connected to the second network ED99. The other electronic devices ED02 and ED04 may be homogeneous or heterogeneous electronic devices with respect to the electronic device ED01. All or part of operations performed by the electronic device ED01 may be performed by one or more of the other electronic devices ED02 and ED04 and the server ED08. For example, when the electronic device ED01 has to perform a function or a service, instead of directly performing the function or the service, the one or more of the other electronic devices may be requested to perform part or all of the function or the service. The one or more of the other electronic devices receiving the request may perform an additional function or service related to the request and may transmit a result of the execution to the electronic device ED01. To this end, cloud computing, distribution computing, and/or client-server computing techniques may be used.

Figure 19:
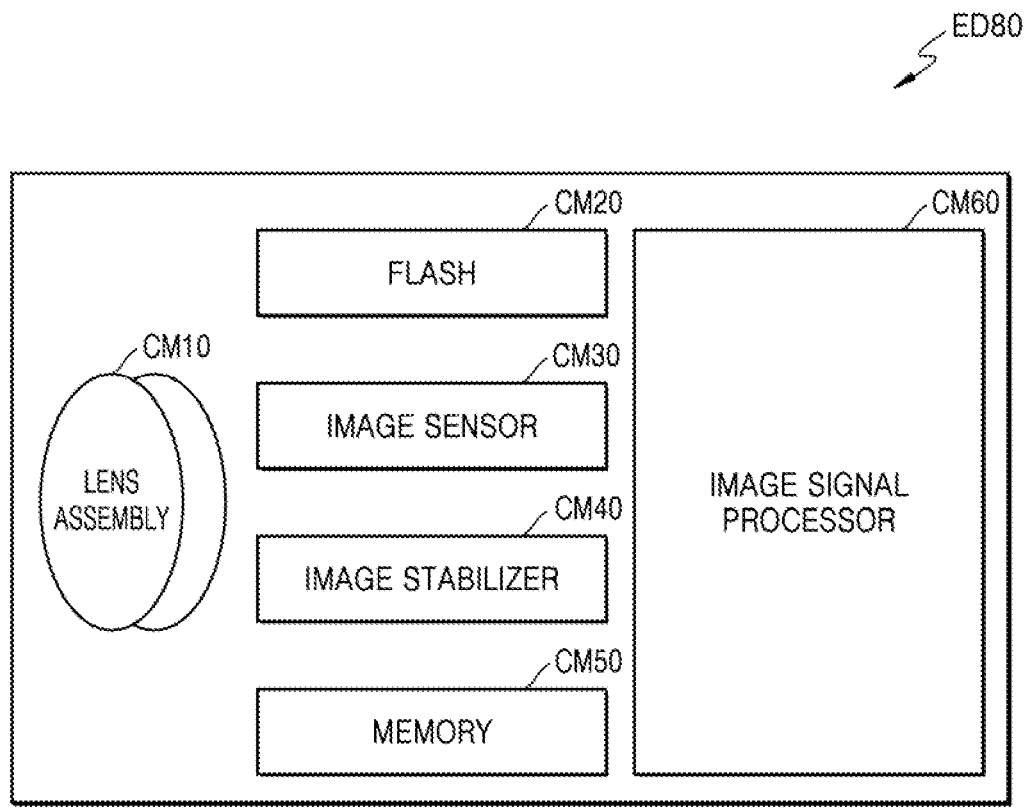
FIG. 19 is a block diagram schematically illustrating the camera module of FIG. 18.
Figure 20:
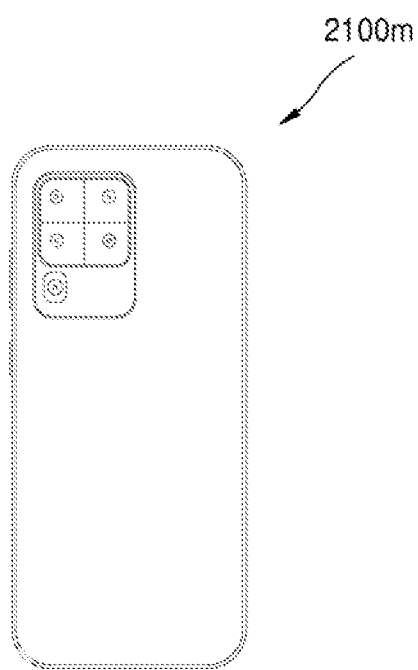
FIGS. 20 to 29 are diagrams illustrating various examples of an electronic device to which an image sensor is applied, according to embodiments.
Figure 21:
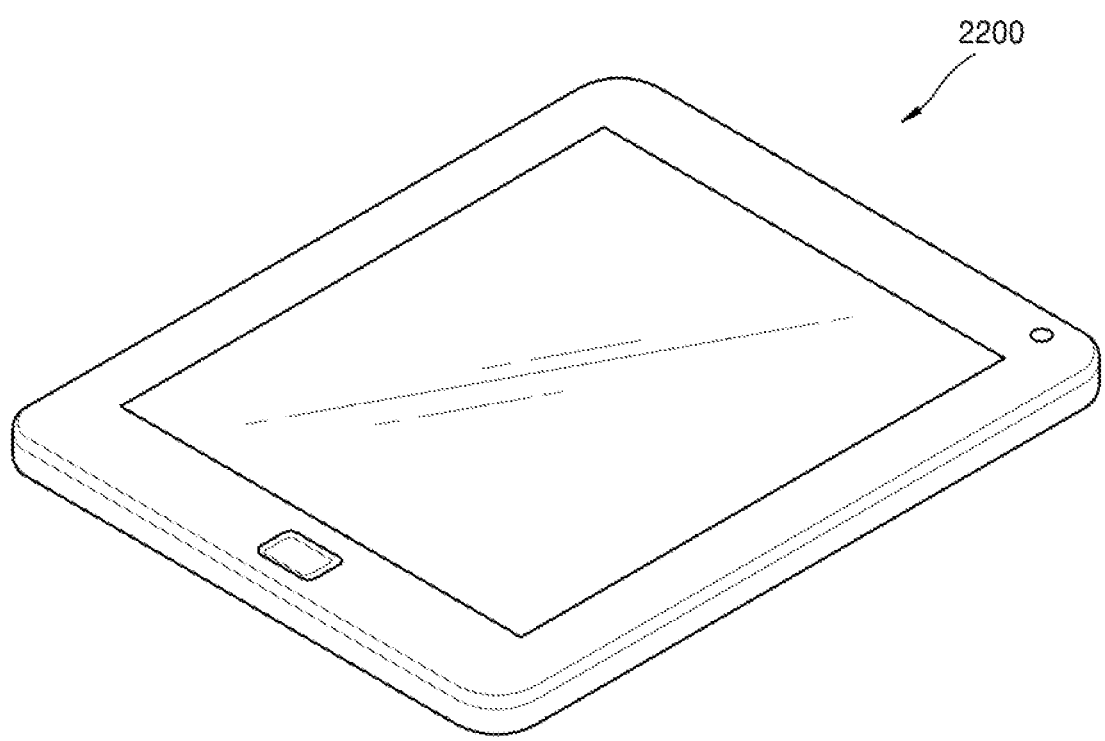
Figure 22:
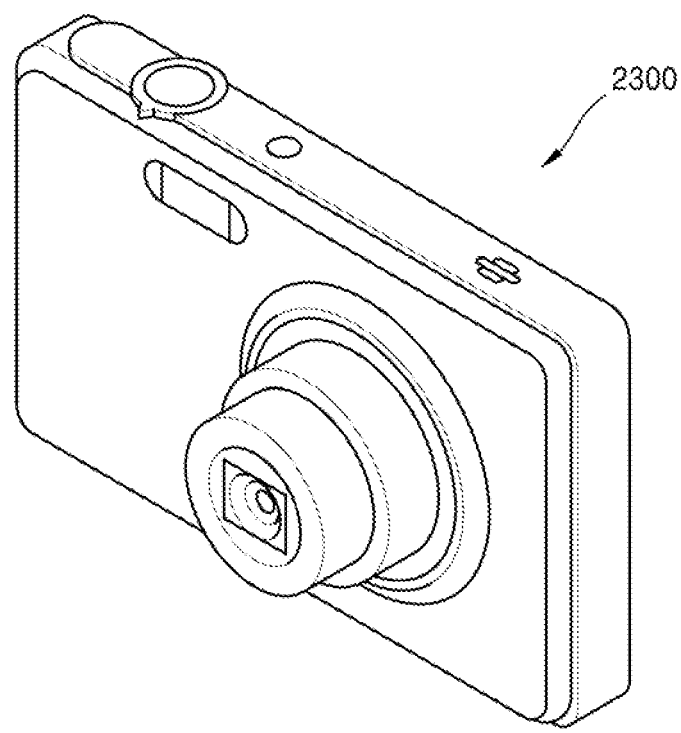
Figure 23:
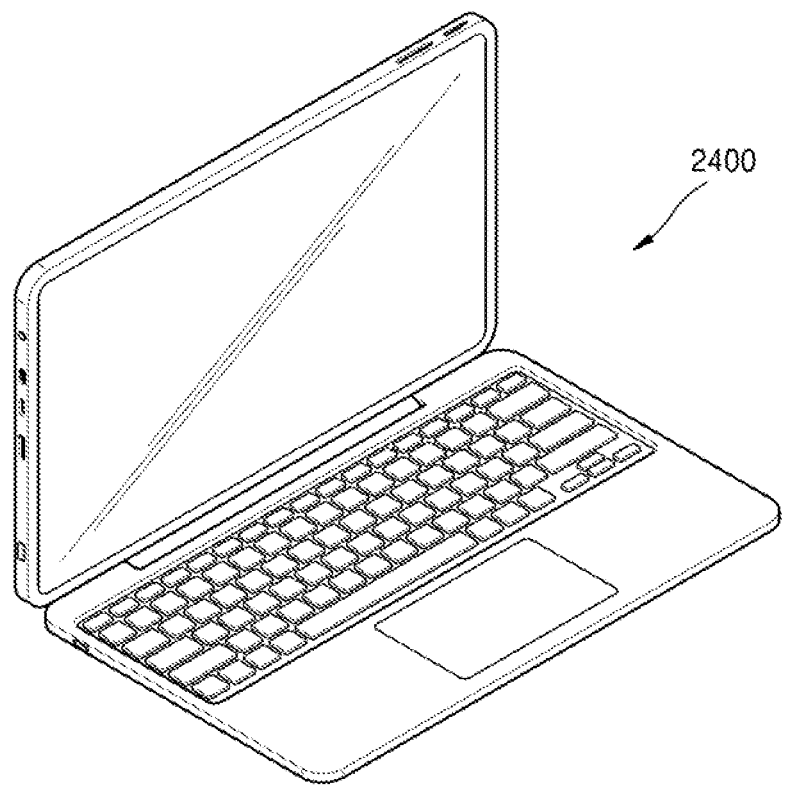
Figure 24:
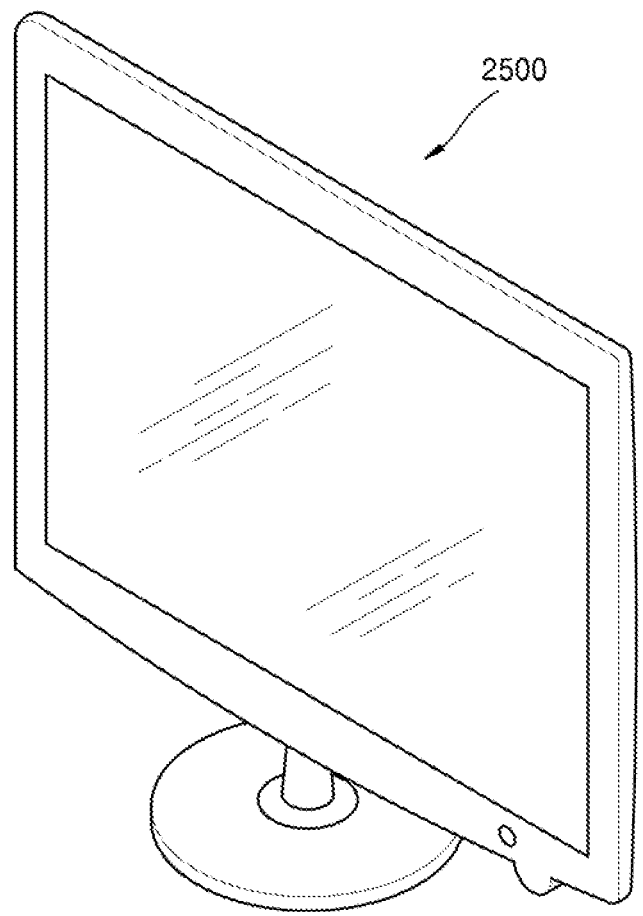

FIG. 19 is a schematic block diagram of the camera module ED80 of FIG. 15.

Referring to FIG. 19, the camera module ED80 may include a lens assembly CM10, a flash CM20, an image sensor CM30, an image stabilizer CM40, a memory CM50 (a buffer memory, etc.), and/or an image signal processor CM60.

The lens assembly CM10 may collect light emitted from an object, an image of which is to be captured. The camera module ED80 may include a plurality of lens assemblies CM10, and in this case, the camera module ED80 may include a dual camera, a 360-degree camera, or a spherical camera. Some of the plurality of lens assemblies CM10 may have the same or different lens properties (a viewing angle, a focal distance, an automatic focal point, an F number, an optical zoom, etc.). The lens assemblies CM10 may include a wide-angle lens or a telephoto lens.

The flash CM20 may emit light that is used to intensify light emitted or reflected from the object. The flash CM20 may include one or more light-emitting diodes (LEDs) (a red-green-blue (RGB) LED, a white LED, and an IR LED, an ultraviolet (UV) LED, etc.) and/or a Xenon lamp. The image sensor CM30 may convert light emitted or reflected from the object and transmitted through the lens assembly CM10 into an electrical signal to obtain an image corresponding to the object. The image sensor CM30 may include a long wavelength infrared sensor and may further include one or more sensors selected from image sensors having different properties, such as an IR sensor or a UV sensor, in addition to an RGB sensor, a black and white (BW) sensor, and the long wavelength infrared sensor. The long wavelength infrared sensor may include any one of the long wavelength infrared sensors 10, 11, and 12 described above.

The image stabilizer CM40 may move one or more lenses included in the lens assembly CM10 or move the image sensor CM30 in a specific direction in response to a motion of the camera module ED80 or the electronic device CM01 including the camera module ED80 or may compensate for a negative effect due to the motion by controlling (adjusting read-out timing, etc.) the operation characteristics of the image sensor CM30. The image stabilizer CM40 may sense the motion of the camera module ED80 or the electronic device ED01 by using a gyro sensor or an acceleration sensor arranged inside or outside the camera module ED80. The image stabilizer CM40 may be implemented in an optical fashion.

The memory CM50 may store part or all of image data obtained through the image sensor CM30 for next image processing operations. For example, when a plurality of images are obtained at a high speed, obtained original data (Bayer-patterned data, high-resolution data, etc.) may be stored in the memory CM50, and after only a low resolution image may be displayed, the original data of a selected image (a user selection, etc.) may be transmitted to the signal processor CM60. The memory CM50 may be integrated in the memory ED30 of the electronic device ED01 or may be implemented as a separate memory independently operating.

The image signal processor CM60 may perform image processing on the image obtained through the image sensor CM30 or the image data stored in the memory CM50. The image processing may include depth map generation, three-dimensional modeling, panorama generation, attribute point extraction, image synthesis, and/or image compensation (noise reduction, resolution adjustment, brightness adjustment, blurring, sharpening, softening, etc.). The image signal processor CM60 may control (for example, an exposure time or control read-out timing of) components (for example, the image sensor CM30, etc.) included in the camera module ED80. The image processed by the image signal processor CM60 may be stored again in the memory CM50 for additional processing or may be provided to the external components (the memory ED30, the display apparatus ED60, the electronic device ED02, the electronic device ED04, the server ED08, etc.) of the camera module ED80. The image signal processor CM60 may be integrated in the processor ED20 or may be implemented as an additional processor independently operating from the processor ED20. When the image signal processor CM60 is implemented as a separate processor from the processor ED20, the image processed by the image signal processor CM60 may be further image-processed by the processor ED20 and may be displayed through the display apparatus ED60.

The electronic device ED01 may include a plurality of camera modules ED80 each having a different attribute or function. In this case, one of the plurality of camera modules ED80 may be a wide-angle camera, and another of the plurality of camera modules ED80 may be a telephoto camera. Similarly, one of the plurality of camera modules ED80 may be a front camera, and another of the plurality of camera modules ED80 may be a rear camera.

FIGS. 20 through 29 are diagrams of various examples of an electronic device in which an image sensor is implemented, according to example embodiments. The image sensor may be substantially the same as the image sensor CM30 described with reference to FIGS. 18 and 19.

Referring to FIGS. 20 through 29, the image sensor may be implemented in various electronic devices. The image sensor may be implemented in a mobile phone or a smartphone 2100m illustrated in FIG. 20, a tablet or a smart tablet 2200 illustrated in FIG. 21, a digital camera or a camcorder 2300 illustrated in FIG. 22, a notebook computer 2400 illustrated in FIG. 23, or a television or a smart television 2500 illustrated in FIG. 24. For example, the smartphone 2100m or the smart tablet 2200 may include a plurality of high resolution cameras, in each of which a high-resolution image sensor is mounted, may extract depth information of objects in an image by using the plurality of high-resolution cameras, may adjust out-focusing of the image, may automatically identify the objects in the image, or may obtain a thermal image of the objects in the image.

Figure 25:
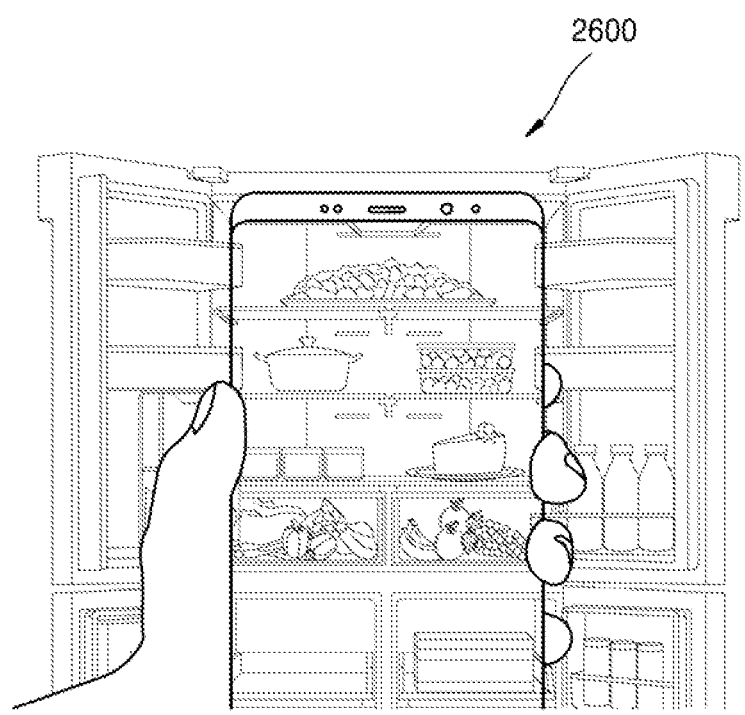
Figure 26:
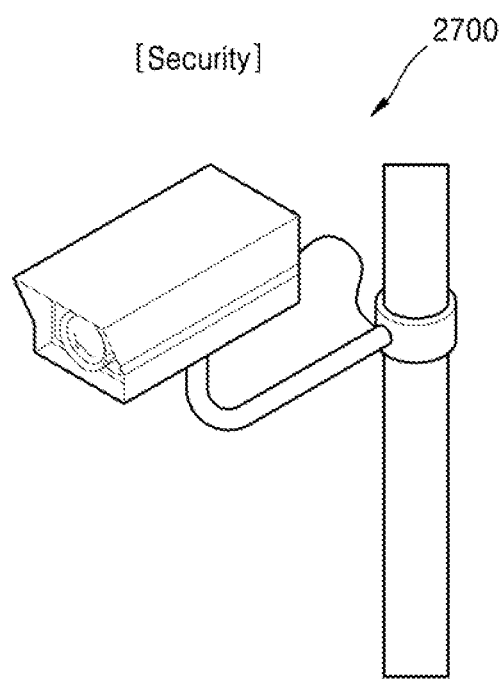
Figure 27:
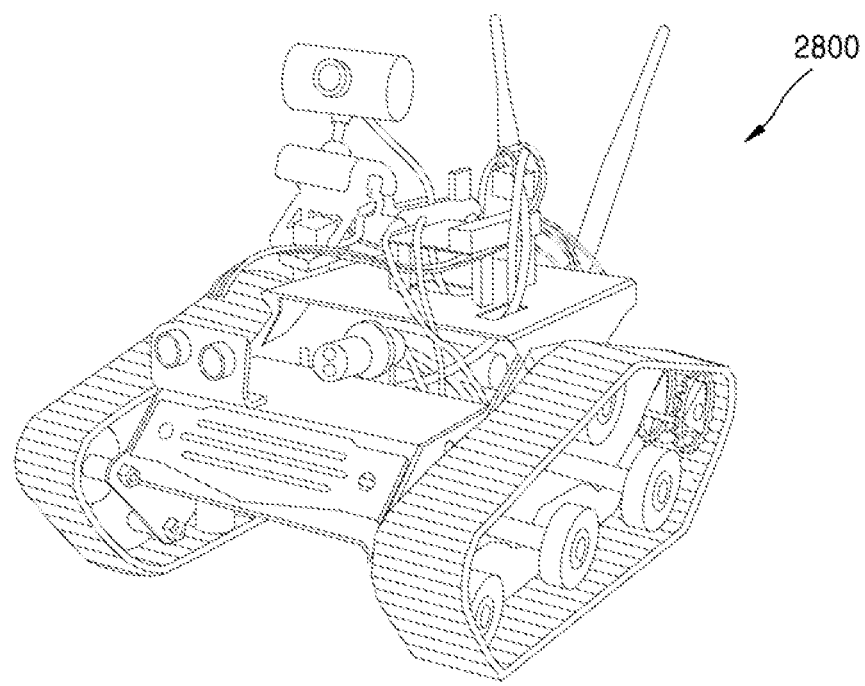
Figure 28:
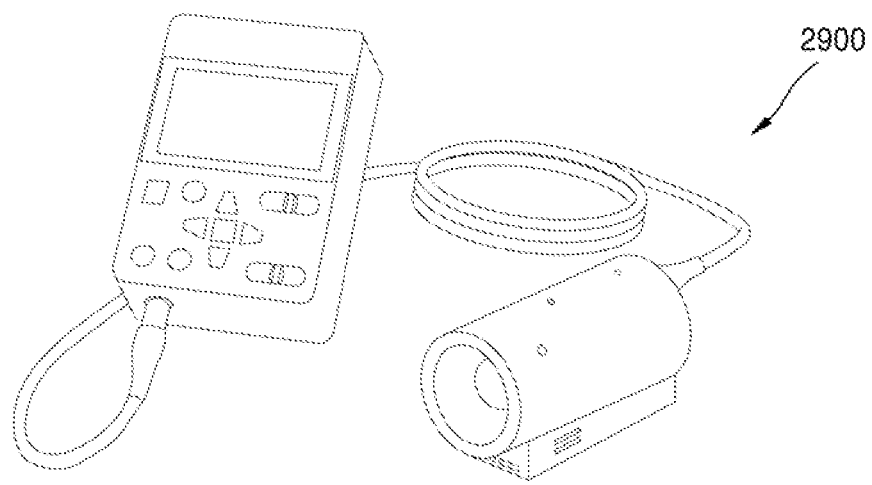

Also, the image sensor may be implemented in a smart refrigerator 2600 illustrated in FIG. 25, a security camera 2700 illustrated in FIG. 26, a robot 2800 illustrated in FIG. 27, a medical camera 2900 illustrated in FIG. 28, etc. For example, the smart refrigerator 2600 may obtain a thermal image of food in the refrigerator by using an image sensor, may automatically recognize the food in the refrigerator, and may notify a user of the presence of specific food, types of foods that are stocked or shipped, etc. by using a smartphone. The security camera 2700 may provide an ultra-high-resolution image and may allow recognition of an object or a human being in the image even in a dark environment through a high sensitivity. The robot 2800 may be dispatched in a disastrous or industrial situation that a human being cannot access and may provide a high-resolution image or a zero image. The medical camera 2900 may provide a high-resolution image or a zero image for a diagnosis or an operation and may dynamically adjust a viewing sight.

Figure 29:
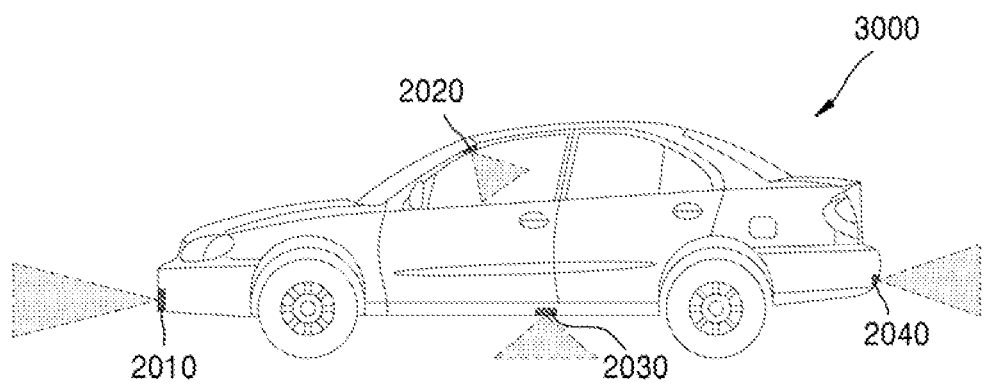

Also, the image sensor may be implemented in a vehicle 3000 as illustrated in FIG. 29. The vehicle 3000 may include a plurality of vehicle cameras 2010, 2020, 2030, and 2040 arranged in various locations, and each vehicle camera 2010, 2020, 2030, or 2040 may include an image sensor according to an embodiment. The vehicle 3000 may provide a user with various information about an inner environment or a peripheral environment of the vehicle 3000 by using the plurality of vehicle cameras 2010, 2020, 2030, and 2040 and may automatically recognize an object or a human being in an image and provide information required for autonomous driving.

The disclosure may provide a long wavelength infrared sensor in which heat is effectively transferred to magnetoresistive elements having an antiparallel state.

The disclosure may provide a long wavelength infrared sensor that reduces manufacturing cost and manufacturing time.

However, the effect of the invention is not limited to the above disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A long wavelength infrared sensor comprising:
   a first magnetoresistive unit;
   a second magnetoresistive unit; and
   a light absorption layer that absorbs light and emits heat,
   wherein the first magnetoresistive unit comprises a first magnetoresistive element and a second magnetoresistive element electrically connected to each other,
   wherein the second magnetoresistive unit comprises a third magnetoresistive element and a fourth magnetoresistive element electrically connected to each other,
   wherein the first magnetoresistive element and the third magnetoresistive element each have an antiparallel state of magnetization direction,
   wherein the second magnetoresistive element and the fourth magnetoresistive element each have a parallel state of magnetization direction, and
   wherein the first magnetoresistive element is electrically connected to the third magnetoresistive element by way of the second magnetoresistive element.

2. The long wavelength infrared sensor of claim 1,
   wherein the first magnetoresistive element comprises a first lower magnetic layer, a first upper magnetic layer provided between the first lower magnetic layer and the light absorption layer, and a first tunneling barrier provided between the first lower magnetic layer and the first upper magnetic layer, and
   wherein the second magnetoresistive element comprises a second lower magnetic layer, a second upper magnetic layer provided between the second lower magnetic layer and the light absorption layer, and a second tunneling barrier provided between the second lower magnetic layer and the second upper magnetic layer,
   wherein a magnetization direction of the first upper magnetic layer is antiparallel to a magnetization direction of the first lower magnetic layer, and
   wherein a magnetization direction of the second upper magnetic layer is parallel to a magnetization direction of the second lower magnetic layer.

3. The long wavelength infrared sensor of claim 2, further comprising:
   an upper conductive line electrically connecting the first upper magnetic layer to the second upper magnetic layer.

4. The long wavelength infrared sensor of claim 2,
   wherein the first upper magnetic layer and the second upper magnetic layer each have a changeable magnetization direction, and
   wherein the first lower magnetic layer and the second lower magnetic layer each have a fixed magnetization direction.

5. The long wavelength infrared sensor of claim 2,
   wherein the first upper magnetic layer and the second upper magnetic layer each have a fixed magnetization direction, and
   wherein the first lower magnetic layer and the second lower magnetic layer each have a changeable magnetization direction.

6. The long wavelength infrared sensor of claim 2, further comprising:
   a lower conductive line electrically connecting the first lower magnetic layer to the second lower magnetic layer.

7. The long wavelength infrared sensor of claim 1,
   wherein the first magnetoresistive element and the third magnetoresistive element have an antiparallel state based on a reset signal passing through all of the first magnetoresistive element, the second magnetoresistive element, the third magneto resistive element, and the fourth magnetoresistive element, and
   wherein the second magnetoresistive element and the fourth magnetoresistive element have a parallel state.

8. The long wavelength infrared sensor of claim 1,
   wherein each of the first magnetoresistive element, the second magnetoresistive element, the third magnetoresistive element, and the fourth magnetoresistive elements comprises a lower magnetic layer, an upper magnetic layer provided between the lower magnetic layer and the light absorption layer, and a tunneling barrier layer provided between the lower magnetic layer and the upper magnetic layer,
   wherein a magnetization direction of the upper magnetic layer is antiparallel to a magnetization direction of the lower magnetic layer in each of the first magnetoresistive element and the third magnetoresistive element, and
   wherein a magnetization direction of the upper magnetic layer is parallel to a magnetization direction of the lower magnetic layer in each of the second magnetoresistive element and the fourth magnetoresistive element.

9. The long wavelength infrared sensor of claim 8, further comprising:

a first upper conductive line electrically connecting the upper magnetic layer of the first magnetoresistive element to the upper magnetic layer of the second magnetoresistive element, and a second upper conductive line electrically connecting the upper magnetic layer of the third magnetoresistive element to the upper magnetic layer of the fourth magnetoresistive element; and a lower conductive line electrically connecting the lower magnetic layer of the second magnetoresistive element to the lower magnetic layer of the third magnetoresistive element.

10. The long wavelength infrared sensor of claim 8, further comprising:

a first lower conductive line electrically connecting the lower magnetic layer of the first magnetoresistive element to the lower magnetic layer of the second magnetoresistive element, and a second lower conductive line electrically connecting the lower magnetic layer of the third magnetoresistive element to the lower magnetic layer of the fourth magnetoresistive element; and an upper conductive line electrically connecting the upper magnetic layer of the second magnetoresistive element to the upper magnetic layer of the third magnetoresistive element.

11. The long wavelength infrared sensor of claim 7, wherein a distance between the first magnetoresistive unit and the second magnetoresistive unit is about 100 nanometers (nm) to about 3 micrometers (μm).

12. The long wavelength infrared sensor of claim 1, wherein a thickness of the light absorption layer is about 3 μm to about 5 μm.

13. The long wavelength infrared sensor of claim 1, further comprising a heat transfer via provided between the light absorption layer and the first magnetoresistive element.

14. The long wavelength infrared sensor of claim 13, wherein the light absorption layer comprises a plurality of layers, and wherein the heat transfer via and a lowermost layer of the plurality of layers of the light absorption layer form a single structure.

15. The long wavelength infrared sensor of claim 1, wherein the light absorption layer is spaced apart from the first magnetoresistive element, and wherein a separation distance between the light absorption layer and the first magnetoresistive element is about 1 μm or less.

16. The long wavelength infrared sensor of claim 1, wherein the light absorption layer is in direct contact with the first magnetoresistive element.

17. The long wavelength infrared sensor of claim 1, wherein a distance between the first magnetoresistive element and the second magnetoresistive element is about 100 nm to about 3 μm.

18. The long wavelength infrared sensor of claim 1, further comprising a reflective layer provided on an opposite side of the light absorption layer with respect to the first magnetoresistive element and the second magnetoresistive element.

19. A long wavelength infrared sensor comprising:
a plurality of magnetoresistive units; and
a light absorption layer that absorbs light and emits heat,
wherein each of the plurality of magnetoresistive units comprises a first magnetoresistive element having an antiparallel state of magnetization direction and a second magnetoresistive element having a parallel state of magnetization direction, wherein the plurality of magnetoresistive units are electrically connected in series, and wherein for each of the magnetoresistive units, the first magnetoresistive element has the antiparallel state of magnetization direction and the second magnetoresistive element has the parallel state of magnetization direction, based on a reset signal being applied to the first magnetoresistive element of a magnetoresistive unit of the plurality of magnetoresistive units that is located at one end of the plurality of magnetoresistive units.

20. An electronic device comprising:
a long wavelength infrared sensor; and
a processor that controls an operation of the long wavelength infrared sensor, and stores and outputs a signal generated by the long wavelength infrared sensor,
wherein the long wavelength infrared sensor comprises:
a first magnetoresistive unit;
a second magnetoresistive unit; and
a light absorption layer that absorbs light and emits heat,
wherein the first magnetoresistive unit comprises a first magnetoresistive element and a second magnetoresistive element electrically connected to each other,
wherein the second magnetoresistive unit comprises a third magnetoresistive element and a fourth magnetoresistive element electrically connected to each other,
wherein the first magnetoresistive element and the third magnetoresistive element have an antiparallel state of magnetization direction,
wherein the second magnetoresistive element and the fourth magnetoresistive element have a parallel state of magnetization direction, and
wherein the first magnetoresistive element is electrically connected to the third magnetoresistive element by way of the second magnetoresistive element.

21. A long wavelength infrared sensor comprising:
a light absorption layer;
a plurality of pixels, each pixel of the plurality of pixels comprising a plurality of magnetoresistive units, each of the plurality of magnetoresistive units comprising a first magnetoresistive element and a second magnetoresistive element; and
a plurality of thermally conductive vias, each of the plurality of thermally conductive vias thermally connecting a portion of the light absorption layer to a respective pixel of the plurality of pixels,
wherein each first magnetoresistive element and each second magnetoresistive element comprises a pinned magnetic layer having a fixed magnetization direction and a free magnetic layer comprising a changeable magnetization direction.

22. The long wavelength infrared sensor of claim 21, wherein each thermally conductive via of the plurality of thermally conductive vias is thermally connected to a respective first magnetoresistive element off the respective pixel.

23. The long wavelength infrared sensor of claim 22, wherein a first magnetoresistive element of a first pixel of the plurality of pixels is electrically connected to a reset signal, and wherein a second magnetoresistive element of a last pixel of the plurality of pixels is electrically connected to an output signal.

24. The long wavelength infrared sensor of claim 23, wherein the plurality of pixels is electrically connected in series such that each first magnetoresistive element except the magnetoresistive element of the first pixel is electrically connected to a second magnetoresistive element of a previous pixel of the plurality of pixels, and
wherein each second magnetoresistive element except the second magnetoresistive element of the last pixel is connected to a first magnetoresistive element of a subsequent pixel of the plurality of pixels.

* * * * *